United States Patent
Chen et al.

(10) Patent No.: US 11,848,239 B2
(45) Date of Patent: Dec. 19, 2023

(54) PATTERNING METHOD AND STRUCTURES RESULTING THEREFROM

(71) Applicant: Taiwan Semiconductor Manufacturing Co., Ltd., Hsinchu (TW)

(72) Inventors: Chieh-Wei Chen, Taoyuan (TW); Jian-Jou Lian, Tainan (TW); Tzu-Ang Chiang, I-Ian (TW); Chun-Neng Lin, Hsinchu (TW); Ming-Hsi Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 175 days.

(21) Appl. No.: 16/925,918

(22) Filed: Jul. 10, 2020

(65) Prior Publication Data
US 2022/0013412 A1 Jan. 13, 2022

(51) Int. Cl.
*H01L 21/8234* (2006.01)
*H01L 21/027* (2006.01)
(Continued)

(52) U.S. Cl.
CPC ........ *H01L 21/823431* (2013.01); *G03F 1/46* (2013.01); *G03F 7/091* (2013.01);
(Continued)

(58) Field of Classification Search
CPC ..... H01L 21/823431; H01L 21/823842; H01L 21/82345; H01L 21/0276; H01L 21/28088; H01L 21/28194; H01L 21/31111; H01L 21/32134; H01L 21/32139; H01L 21/823821; H01L 29/66795; H01L 29/66545; H01L 29/42364; H01L 29/401; H01L 29/42372; H01L 27/0886;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

| CN | 101722158 | * | 9/2011 | ............... B08B 3/08 |
| EP | 3 316 289 | * | 5/2018 | ......... H01L 21/8238 |

(Continued)

*Primary Examiner* — Mary A Wilczewski
(74) *Attorney, Agent, or Firm* — Slater Matsil, LLP

(57) ABSTRACT

A method includes depositing a first work function layer over a gate dielectric layer, forming a first hard mask layer over the first work function layer, forming a photoresist mask over the first hard mask layer, where forming the photoresist mask includes depositing a bottom anti-reflective coating (BARC) layer over the first hard mask layer, etching a portion of the BARC layer, etching a portion of the first hard mask layer using the BARC layer as a mask, etching a portion of the first work function layer to expose a portion of the gate dielectric layer through the first hard mask layer and the first work function layer, removing the first hard mask layer, and depositing a second work function layer over the first work function layer and over the portion of the gate dielectric layer.

20 Claims, 29 Drawing Sheets

(51) Int. Cl.
*H01L 21/336* (2006.01)
*G03F 1/46* (2012.01)
*G03F 7/09* (2006.01)
*H01L 29/66* (2006.01)
*H01L 29/78* (2006.01)

(52) U.S. Cl.
CPC .... *H01L 21/0276* (2013.01); *H01L 21/82345* (2013.01); *H01L 29/66795* (2013.01)

(58) Field of Classification Search
CPC ............ H01L 27/0924; H01L 27/1211; H01L 28/785; H01L 29/785; H01L 29/41791; H01L 21/82365; G03F 1/46; G03F 7/091
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,734,227 B2 * | 8/2020 | Li | H01L 21/32139 |
| 11,195,717 B2 * | 12/2021 | Li | H01L 21/0332 |
| 2004/0048203 A1 * | 3/2004 | Furusawa | H01L 21/76814 257/E21.252 |
| 2010/0237424 A1 | 9/2010 | Cheng et al. | |
| 2012/0126336 A1 | 5/2012 | Anderson et al. | |
| 2014/0193945 A1 * | 7/2014 | Li | H01L 21/31111 252/79.4 |
| 2015/0056813 A1 * | 2/2015 | Huang | H01L 21/31144 438/703 |
| 2015/0126041 A1 | 5/2015 | Chatterjee et al. | |
| 2015/0221743 A1 | 8/2015 | Ho et al. | |
| 2015/0261087 A1 * | 9/2015 | Chen | G03F 7/091 438/514 |
| 2016/0268414 A1 | 9/2016 | Park et al. | |
| 2016/0351700 A1 | 12/2016 | Chang et al. | |
| 2018/0019242 A1 * | 1/2018 | Liao | H01L 27/0924 |
| 2018/0122806 A1 * | 5/2018 | Li | H01L 21/823842 |
| 2019/0088556 A1 | 3/2019 | Huang et al. | |
| 2020/0135588 A1 * | 4/2020 | Wu | H01L 21/32105 |
| 2020/0312985 A1 | 10/2020 | Chang et al. | |
| 2022/0013412 A1 * | 1/2022 | Chen | H01L 21/28088 |

FOREIGN PATENT DOCUMENTS

| | | | | |
|---|---|---|---|---|
| EP | 3 937 255 | * | 1/2022 | ........ H01L 21/8234 |
| TW | 201642326 A | | 12/2016 | |
| WO | WO 2007/030476 | * | 3/2007 | ....... H01L 21/67051 |

* cited by examiner

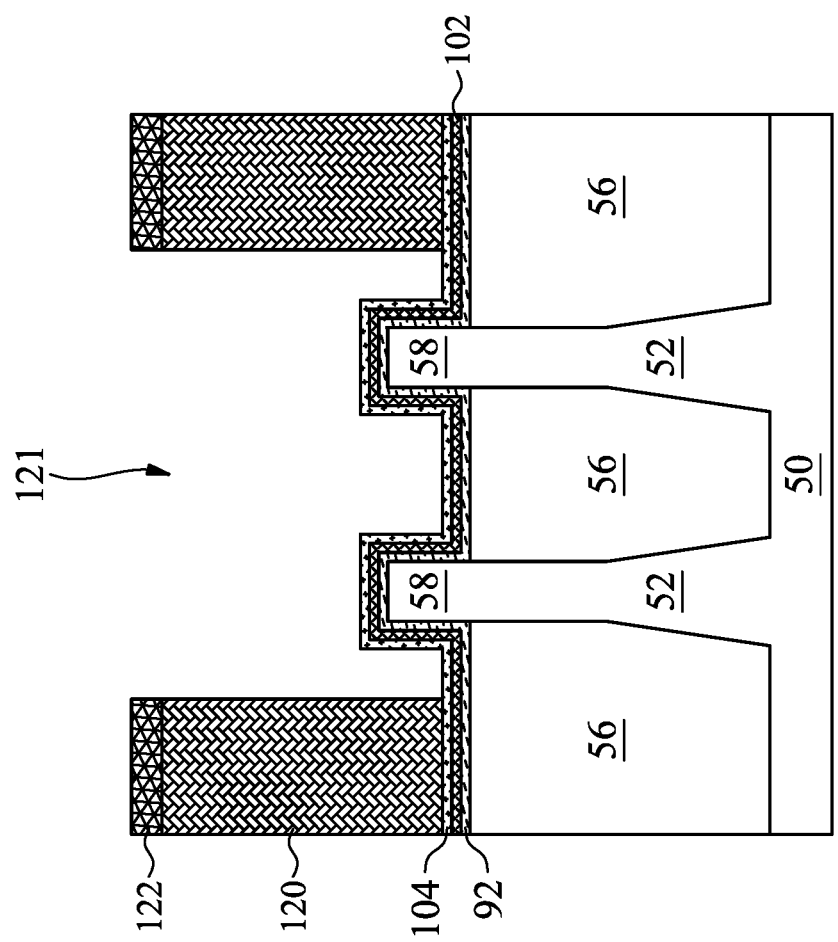
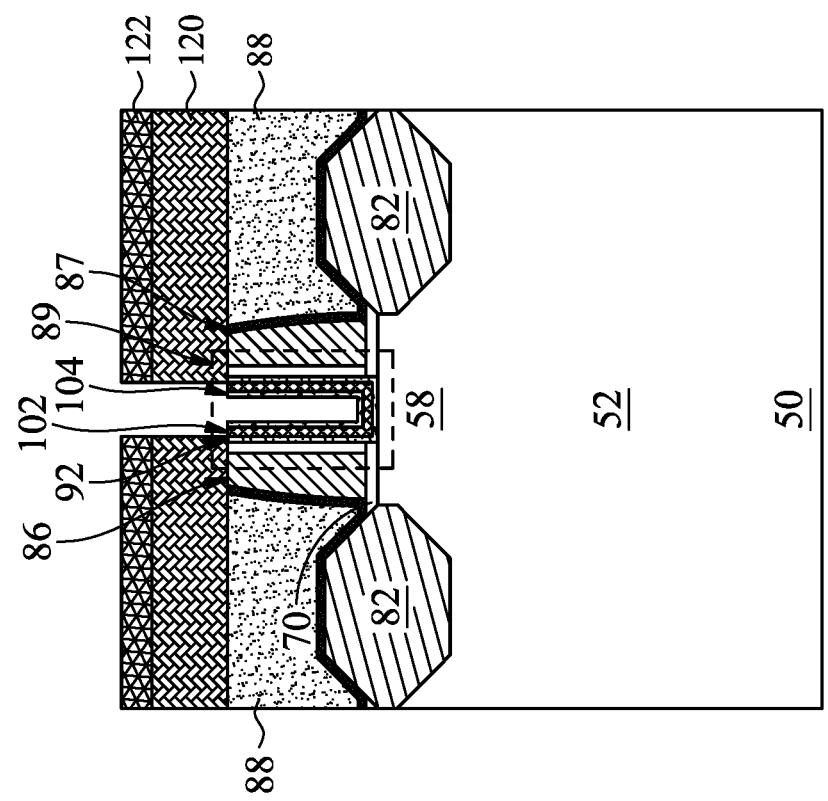
Figure 19A
Figure 19B

PATTERNING METHOD AND STRUCTURES RESULTING THEREFROM

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14, 15, 16, 17, 18, 19A, 19B, 20, 21, 22, 23, 24, 25, 26A, 26B, 27A, 27B, 28A, and 28B are cross-sectional views of intermediate stages in the manufacturing of FinFETs, in accordance with some embodiments.

DETAILED DESCRIPTION

Figure 1:
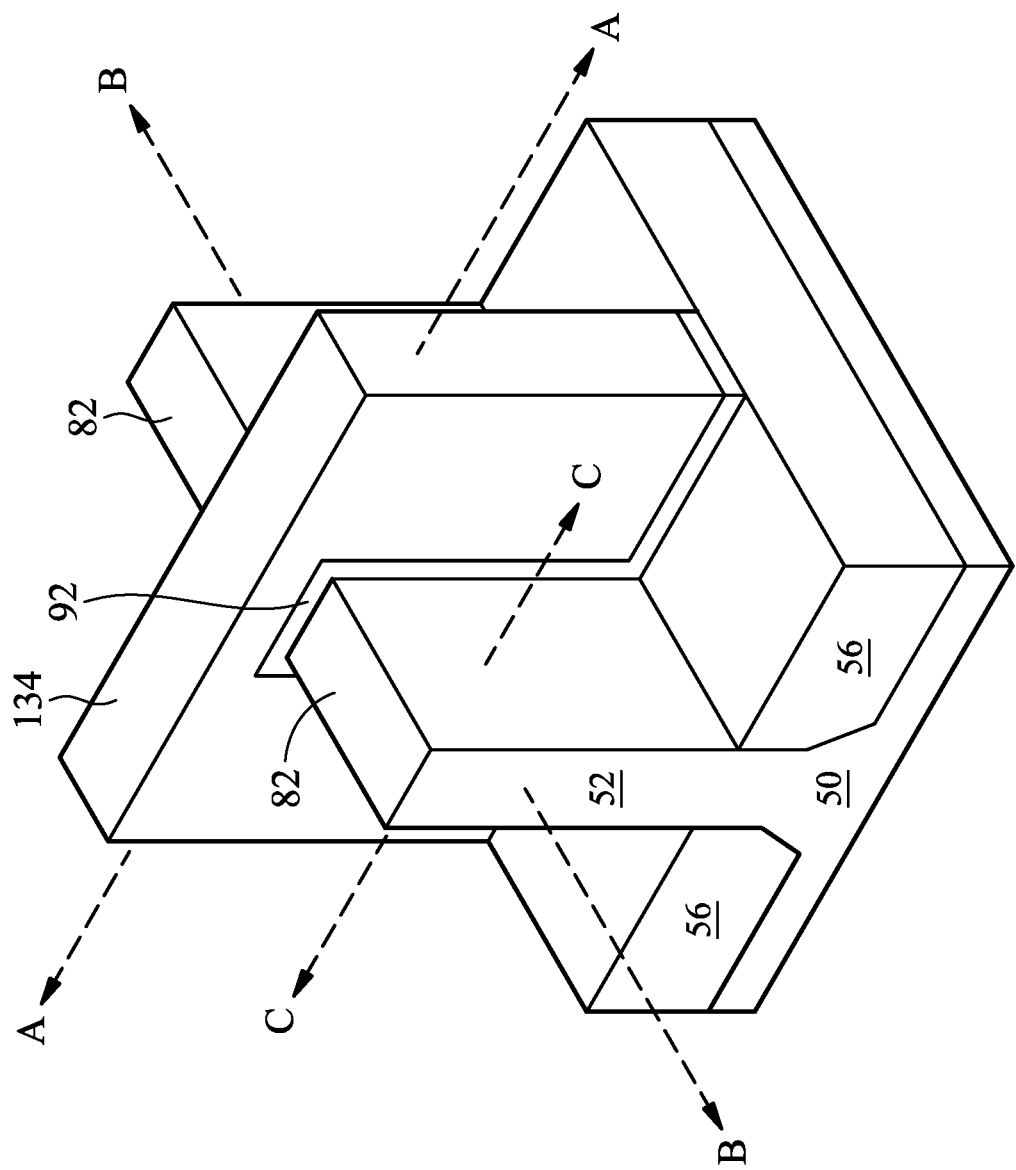
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to a replacement gate stack formation process. The embodiments of the present disclosure are discussed in the context of forming a Fin Field-Effect Transistor (FinFET) device. However, the methods of the present disclosure may be applicable to other types of devices (e.g., a planar transistor, a nanostructure (including nanowire and gate all around) field effect transistor (NSFET), or the like). The gate stack includes a gate dielectric layer such as a high-k dielectric layer, and a work function layer. The embodiments of the present disclosure describe a patterning process to precisely pattern the work function layer that minimizes damage to the gate dielectric layer. The patterning process may utilize a first hard mask layer over the work function layer, and a photoresist over the first hard mask layer, wherein the photoresist may include a bottom anti-reflective coating (BARC) layer, a second hard mask layer, and a photosensitive layer. The first hard mask layer is used to protect the work function layer and the gate dielectric layer during the etching of the subsequently deposited bottom anti-reflective coating (BARC) layer over the first hard mask layer. The precise patterning of the work function layer may be used, for example, to fine tune threshold voltage (Vt) of the resulting transistor, precisely control the metal gate height, and allow for the complete removal of the work function layer while minimizing damage to the gate dielectric layer. Forming the first hard mask layer over the work function layer allows for the use of a wet etching process to precisely pattern the work function layer. The use of this method may minimize damage to the gate dielectric layer and reduces metal gate deformation and gate width changes while patterning the work function layer.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described and illustrated as being separate from the substrate 50, as used herein the term "substrate" may be used to refer to the substrate 50 alone or the substrate 50 and the STI regions 56 in combination. Additionally, although the fin 52 and the substrate 50 are illustrated as a single, continuous material, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a conductive fill material 134 is over the gate dielectric layer 92. Source/drain regions 82 are disposed in opposite sides of the fin 52 with respect to the gate dielectric layer 92 and conductive fill material 134. FIG. 1 further illustrates reference cross-sections that are used in later figures. Cross-section A-A is along a longitudinal axis of the conductive fill material 134 and in a direction, for example, perpendicular to the direction of current flow between the source/drain regions 82 of the FinFET. Cross-section B-B is perpendicular to the cross-section A-A and is along a longitudinal axis of the fin 52 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Some embodiments discussed herein illustrate the patterning of a p-type work function layer. This is illustrated as an example and the methods discussed herein can be used for patterning either a p-type work function layer or an n-type work function layer in any type of device (e.g., a p-type device or an n-type device). In addition, some embodiments contemplate aspects used in planar devices, such as planar FETs.

FIGS. 2 through 28B are cross-sectional views of intermediate stages in the manufacturing of FinFETs, in accordance with some embodiments. FIGS. 2, 3, 4, 5, 6, 7, 14, 15, 16, 17, 18, 20, 21, 22, 23, 24, and 25 illustrate reference cross-section A-A illustrated in FIG. 1, except for multiple fins/FinFETs. In FIGS. 8A through 28B, figures ending with an "A" designation are illustrated along reference cross-section A-A illustrated in FIG. 1 and figures ending with a "B" designation are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
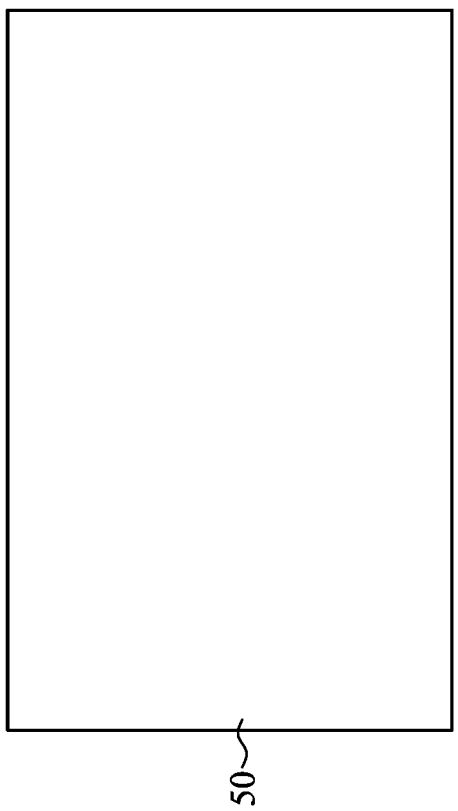

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type dopant or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
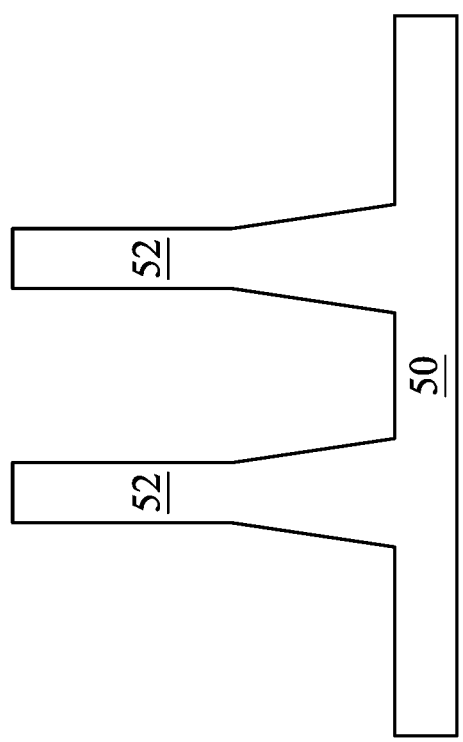

In FIG. 3, fins 52 are formed in the substrate 50. The fins 52 are semiconductor strips. In some embodiments, the fins 52 may be formed in the substrate 50 by etching trenches in the substrate 50. The etching may be one or more of any acceptable etch process, such as a reactive ion etch (RIE), neutral beam etch (NBE), the like, or a combination thereof. The etching may be anisotropic. Although the fins 52 are illustrated in FIG. 3 as having linear edges, the fins 52 may have rounded edges or any other suitable shape.

Any suitable method may be used to pattern the fins 52. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 50 and patterned using a photolithography process. Spacers are formed alongside the patterned sacrificial layer using a self-aligned process. The sacrificial layer is then removed, and the remaining spacers may then be used to pattern the fins 52.

Figure 4:
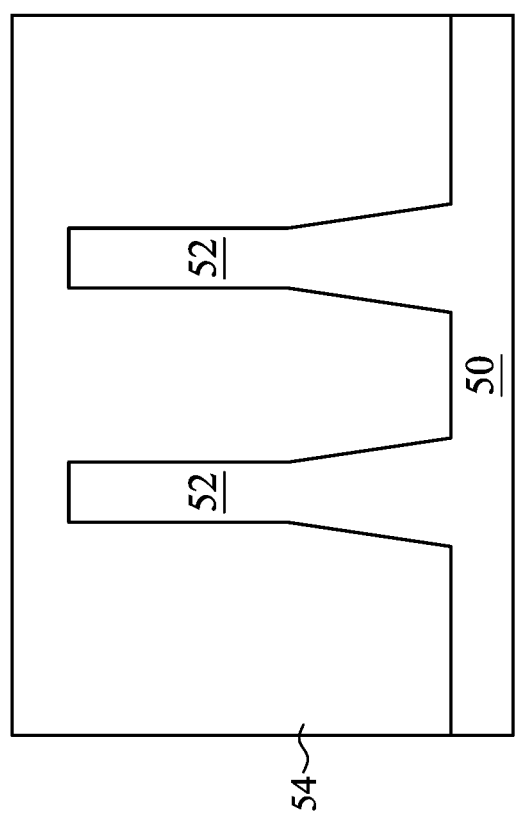

In FIG. 4, an insulation material 54 is formed over the substrate 50 and between neighboring fins 52. The insulation material 54 may be an oxide, such as silicon oxide, a nitride, the like, or a combination thereof, and may be formed by high density plasma chemical vapor deposition (HDP-CVD), flowable chemical vapor deposition (FCVD) (e.g., a CVD-based material deposition in a remote plasma system, followed by a post-deposition cure to convert the material to another material, such as an oxide), the like, or a combination thereof. Other insulation materials formed by any acceptable process may be used. In the illustrated embodiment, the insulation material 54 is silicon oxide formed by an FCVD process. An anneal process may be performed once the insulation material is formed. In an embodiment, the insulation material 54 is formed such that excess insulation material covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
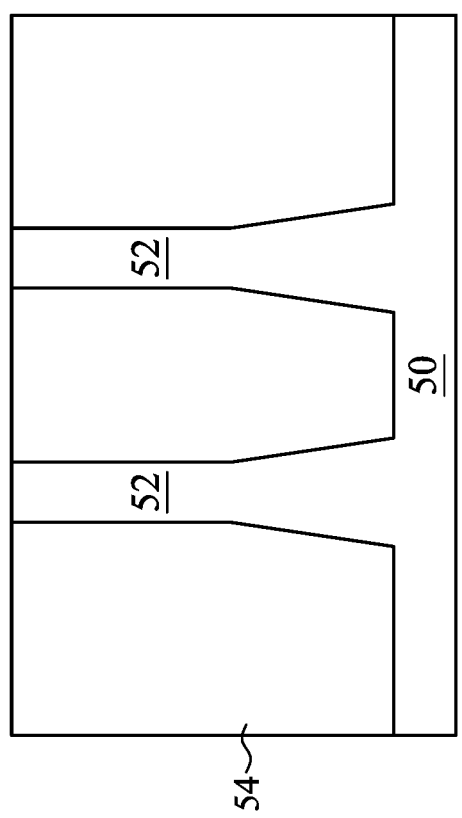

In FIG. 5, a removal process is applied to the insulation material 54 to remove excess material of the insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete.

Figure 6:
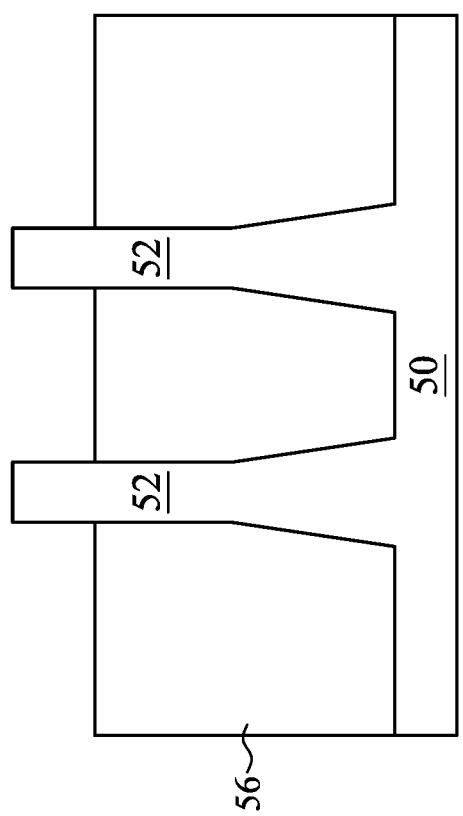

In FIG. 6, the insulation material 54 is recessed to form shallow trench isolation (STI) regions 56. The insulation material 54 is recessed such that fins 52 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by using an appropriate etch. The STI regions 56 may be recessed using an acceptable etching process, such as one that is selective to the material of the insulation material 54 (e.g., an etching process which etches the material of the insulation material 54 at a higher rate than the material of the fins 52). For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer may be formed over a top surface of the substrate 50, and trenches may be etched through the dielectric layer to expose the underlying substrate 50. Homoepitaxial structures may be epitaxially grown in the trenches, and the dielectric layer may be recessed such that the homoepitaxial structures protrude from the dielectric layer to form the fins 52.

Additionally, in some embodiments, heteroepitaxial structures may be used for the fins 52. For example, the fins 52 in FIG. 5 may be recessed, and a material different from the fins 52 may be epitaxially grown in their place. In a further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

In various embodiments, the fins 52 may be formed from silicon germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, in FIG. 6, appropriate wells (not separately illustrated) may be formed in the fins 52 and/or the substrate 50. For example, a P well may be formed in fins 52 and/or the substrate 50 for forming n-type devices, such as NMOS transistors, e.g., n-type FinFETs. In other embodiments, an N well may be formed in fins 52 and/or the substrate 50 for forming p-type devices, such as PMOS transistors, e.g., p-type FinFETs.

The different implant steps for the formation of a P well in fins 52 and/or the substrate 50 for forming n-type devices, such as NMOS transistors, e.g., n-type FinFETs, may be achieved using a photoresist or other masks (not separately illustrated). For example, a photoresist may be formed over the fins 52 and the STI regions 56. The photoresist is patterned to expose the fins 52 and/or the substrate 50, such as the NMOS region. The photoresist may be formed by using a spin-on technique and may be patterned using acceptable photolithography techniques. Once the photoresist is patterned, a p-type impurity implant is performed in the exposed region of the fins 52 and/or the substrate 50. The p-type impurities may be boron, $BF_2$, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process. In other embodiments, a similar process may be used to form an N well in fins 52 and/or the substrate 50 for forming p-type devices, such as PMOS transistors, e.g., p-type FinFETs. For example, a photoresist may be formed over the fins 52 and the STI regions 56. The photoresist is patterned to expose the fins 52 and/or the substrate 50, such as the PMOS region. The photoresist may be formed by using a spin-on technique and may be patterned using acceptable photolithography techniques. Once the photoresist is patterned, an n-type impurity implant is performed in the exposed region of the fins 52 and/or the substrate 50. The n-type impurities may be phosphorus, arsenic, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

After the implants to form the P well in fins 52 and/or the substrate 50, an anneal may be performed to activate the p-type impurities that were implanted. In some embodiments, the grown materials of epitaxial fins may be in situ doped during growth, which may obviate the implantations. According to some embodiments, in situ and implantation doping may be used together.

Figure 7:
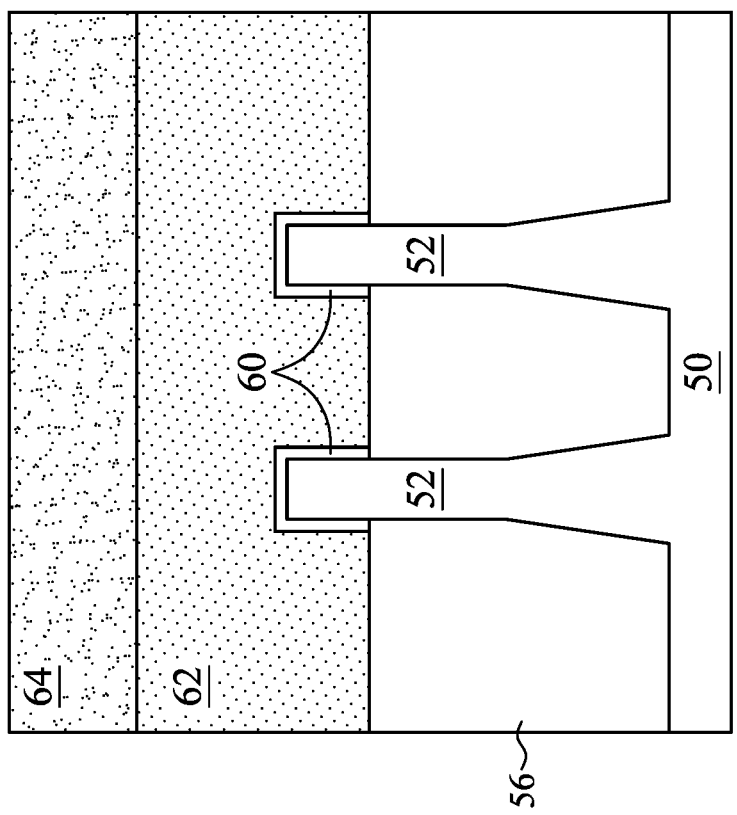

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group amorphous silicon, including polycrystalline silicon (polysilicon), polycrystalline silicon-germanium (poly-SiGe), metallic nitrides, metallic silicides, metallic oxides, and metals. The dummy gate layer 62 may be deposited by physical vapor deposition (PVD), chemical vapor deposition (CVD), sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed over dummy dielectric layer 60. In some embodiments, separate dummy gate layers and separate mask layers may be formed over the dummy dielectric layer 60. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 8B:
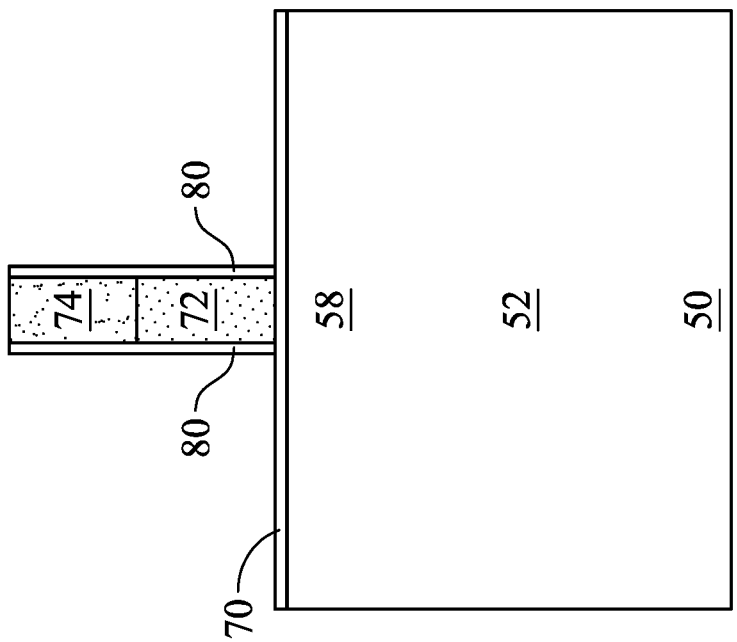
Figure 8A:
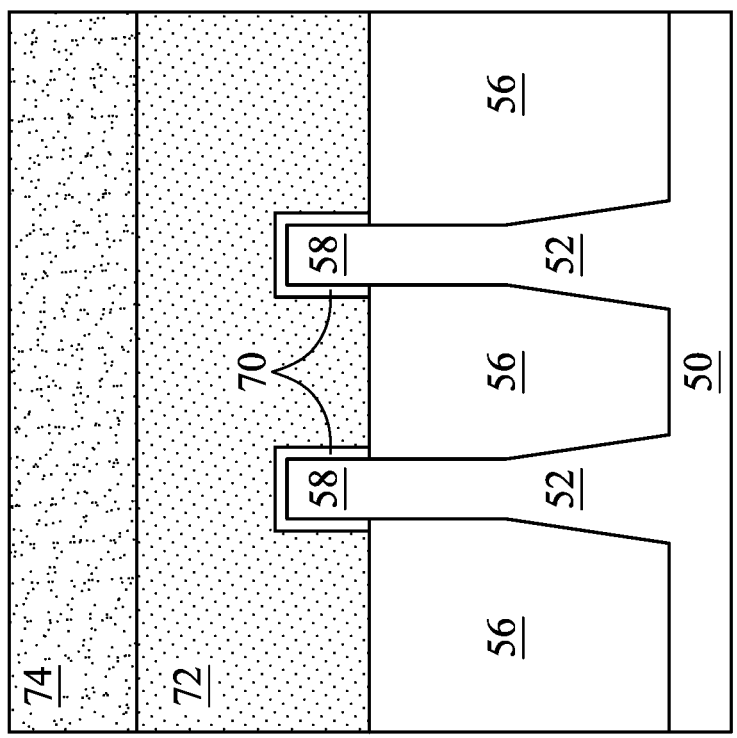

FIGS. 8A through 13B illustrate various additional steps in the manufacturing of embodiment devices. In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72 and dummy dielectrics 70, respectively. The dummy gates 72 cover respective channel regions 58 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective fins 52.

The mask layer 64 and the dummy gate layer 62 may be patterned by any suitable method. For example, the mask layer 64 and the dummy gate layer 62 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the mask layer 64 and patterned using a photolithography process. Spacers are formed alongside the patterned sacrificial layer using a self-aligned process. The sacrificial layer is then removed, and the remaining spacers may then be used to pattern the mask layer 64 and the dummy gate layer 62.

FIGS. 8A and 8B further illustrate the formation of gate seal spacers 80 on exposed surfaces of the dummy gates 72, the masks 74, the dummy dielectrics 70, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed and patterned to expose fins 52, and appropriate type (e.g., n-type or p-type) impurities may be implanted into the exposed fins 52. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
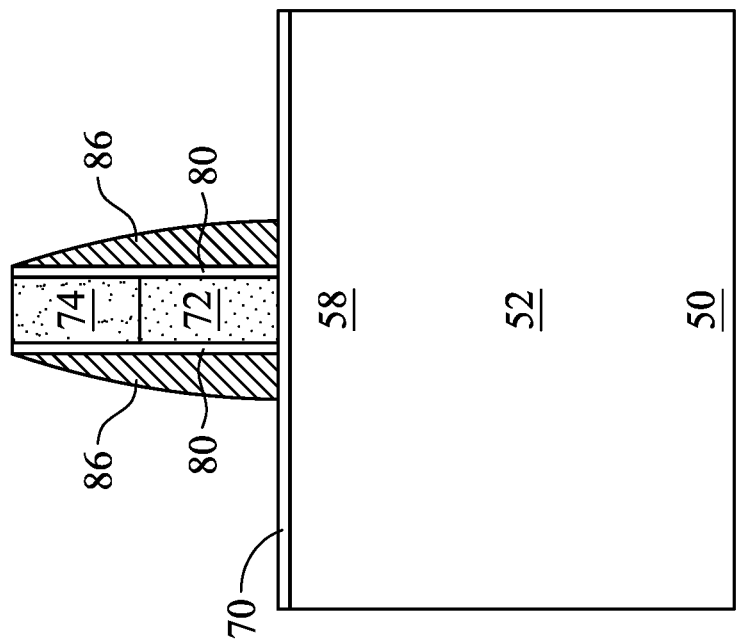
Figure 9A:
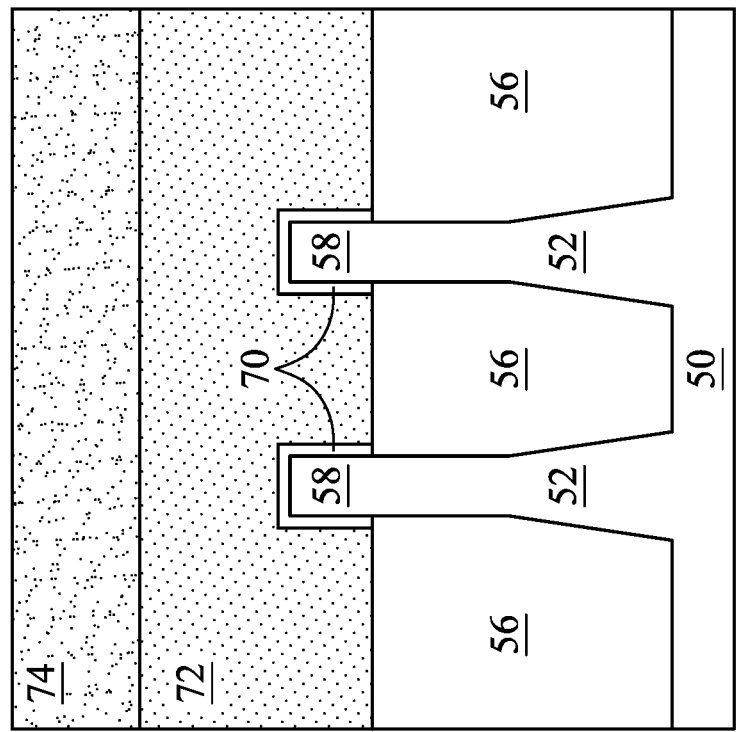

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 10B:
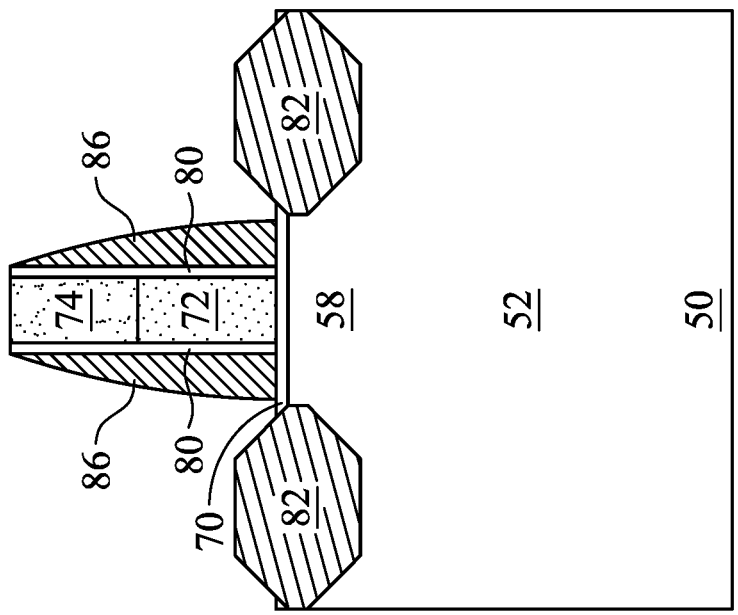
Figure 10A:
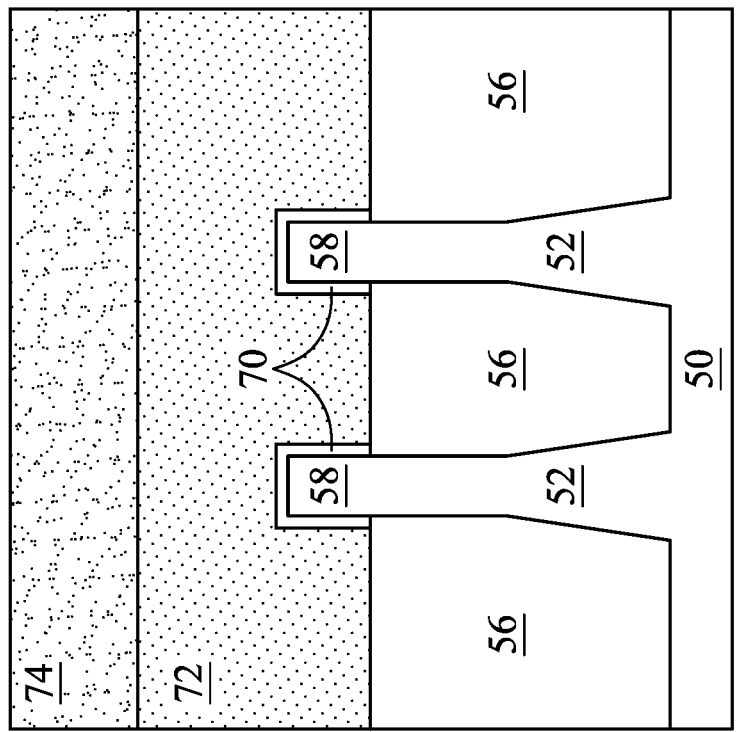
Figure 10C:
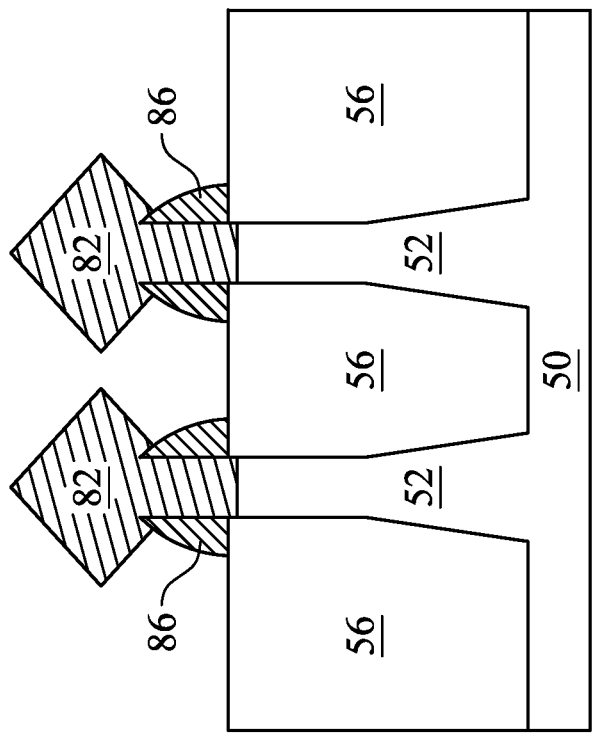
Figure 10D:
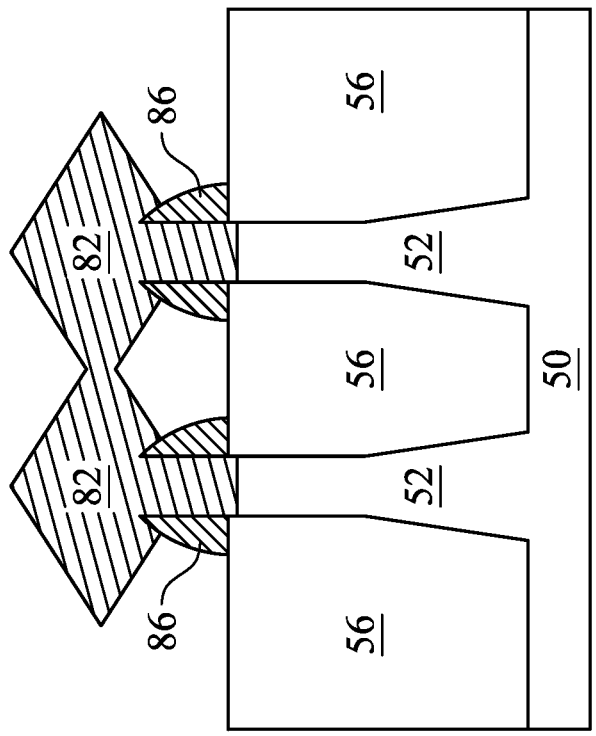

In FIGS. 10A and 10B epitaxial source/drain regions 82 are formed in the fins 52. A material of the epitaxial source/drain regions 82 may be selected exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the fins 52 may be formed by etching source/drain regions of the fins 52 to form recesses in the fins 52. Then, the epitaxial source/drain regions 82 are epitaxially grown in the recesses in the fins 52 to form n-type devices, such as NMOS transistors, e.g., n-type FinFETs. The epitaxial source/drain regions 82 may include any acceptable material, such as materials appropriate for n-type FinFETs. For example, if the fin 52 is silicon, the epitaxial source/drain regions 82 may include materials exerting a tensile strain in the channel region 58, such as silicon, SiC, SiCP, SiP, or the like. The epitaxial source/drain regions 82 may have surfaces raised from respective surfaces of the fins 52 and may have facets. In other embodiments, the epitaxial source/drain regions 82 are epitaxially grown in the recesses in the fins 52 to form p-type devices, such as PMOS transistors, e.g., p-type FinFETs. The epitaxial source/drain regions 82 may include any acceptable material, such as materials appropriate for p-type FinFETs. For example, if the fin 52 is silicon or silicon germanium, the epitaxial source/drain regions 82 in the region second 50P may comprise materials exerting a compressive strain in the channel region 58, such as SiGe, SiGeB, Ge, GeSn, or the like. The epitaxial source/drain regions 82 may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed.

In some embodiments, the epitaxial source/drain regions 82 may be in situ doped during growth.

Because of the epitaxy processes used to form the epitaxial source/drain regions 82 in the fins 52, upper surfaces of the epitaxial source/drain regions have facets, which expand laterally outward beyond a sidewalls of the fins 52. In some embodiments, these facets cause adjacent epitaxial source/drain regions 82 of a same finFET to merge as illustrated by FIG. 10C. In other embodiments, adjacent epitaxial source/drain regions 82 remain separated after the epitaxy process is completed as illustrated by FIG. 10D.

Figure 11B:
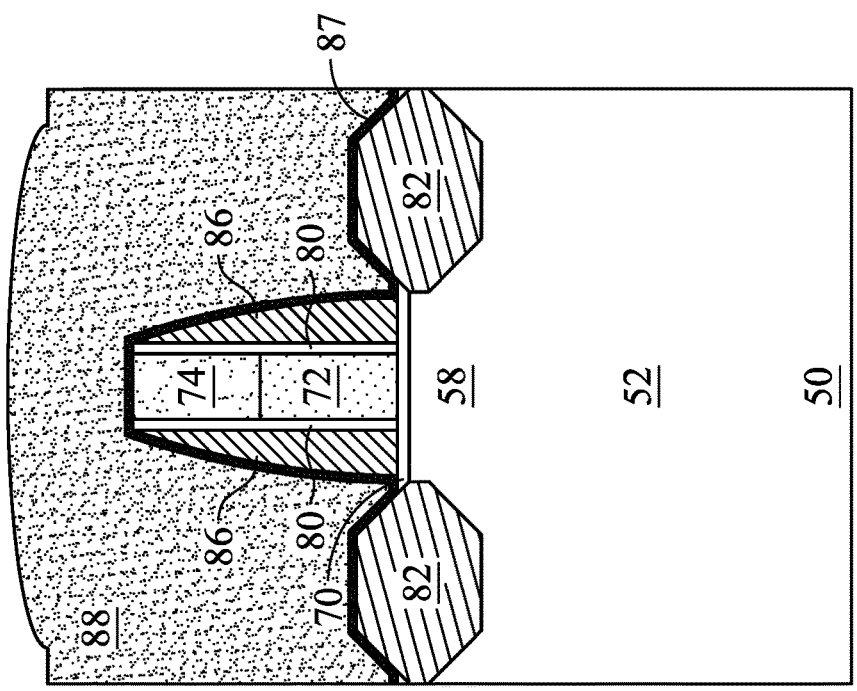
Figure 11A:
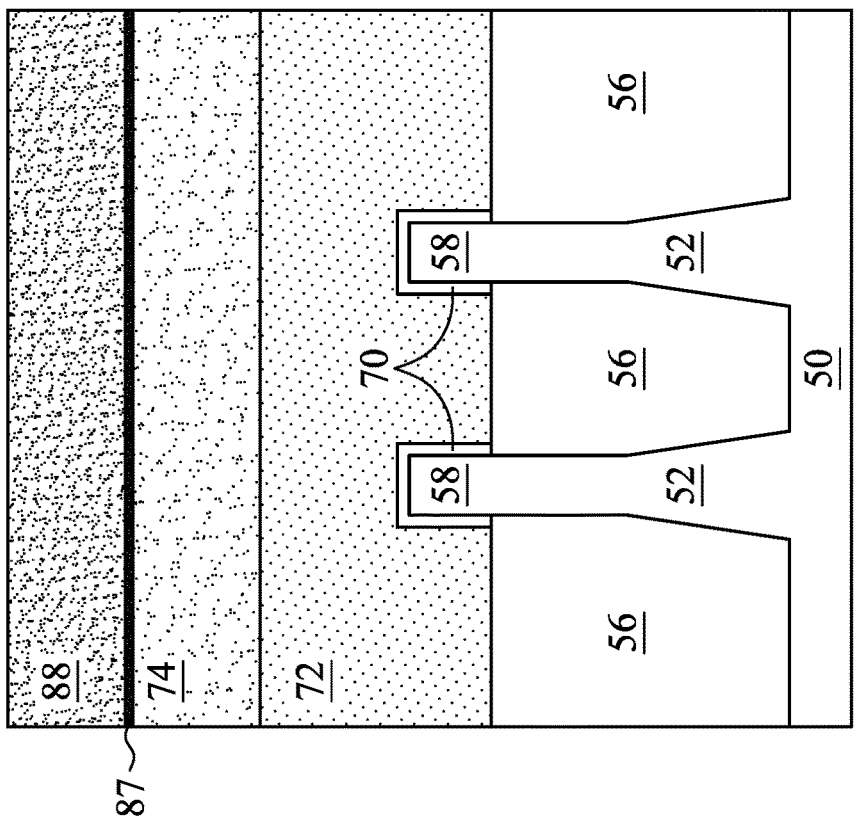

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation or semiconductor materials formed by any acceptable process may be used. In some embodiments, a contact etch stop layer (CESL) 87, is disposed between the first ILD 88 and the epitaxial source/drain regions 82, the masks 74, the gate spacers 86, and the gate seal spacers 80. The CESL 87 may comprise a dielectric material, such as, silicon nitride, silicon oxide, silicon oxynitride, combinations thereof, or the like, having a different etch rate than the material of the overlying first ILD 88.

Figure 12B:
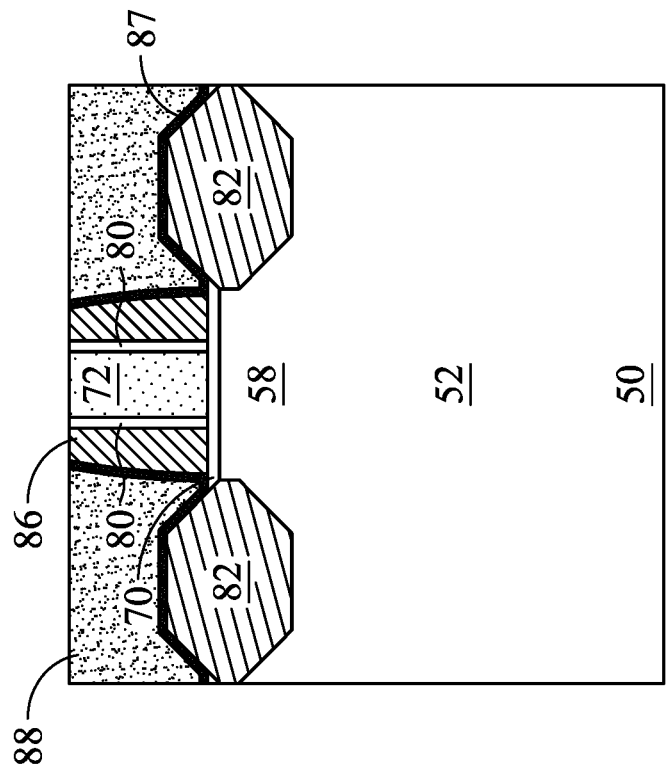
Figure 12A:
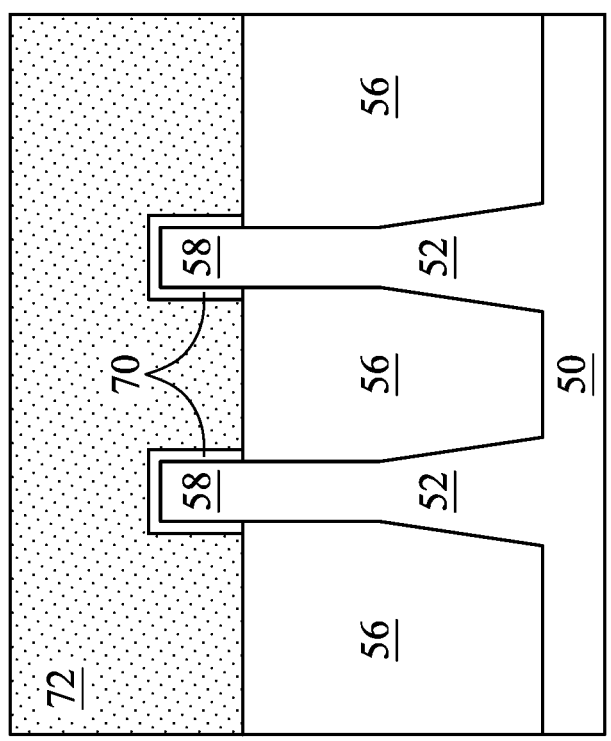

In FIGS. 12A and 12B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 13B:
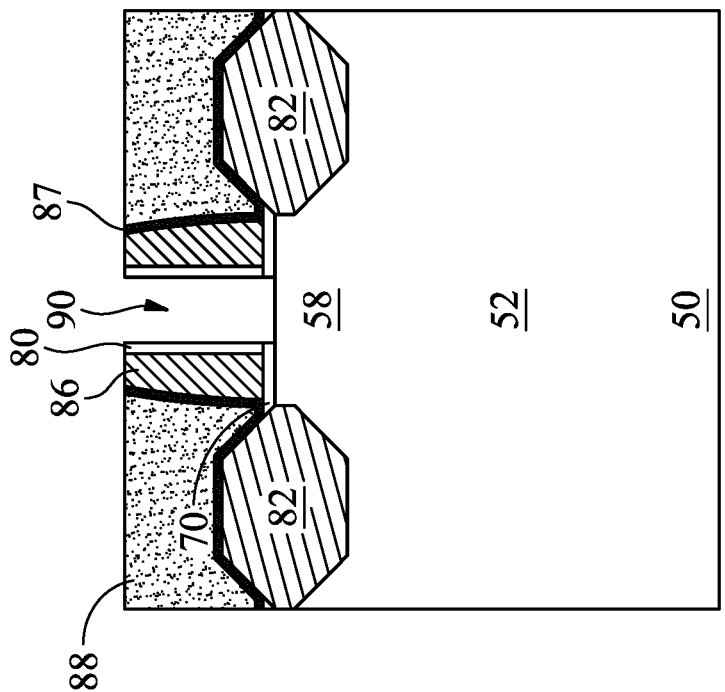
Figure 13A:
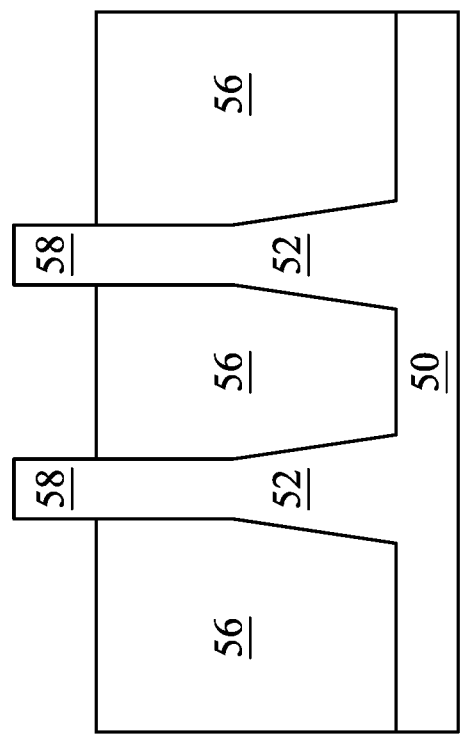

In FIGS. 13A and 13B, the dummy gates 72 and portions of the dummy dielectrics 70 directly underlying the exposed dummy gates 72 are removed in an etching step(s), so that recesses 90 are formed. In some embodiments, the dummy gates 72 are removed by an anisotropic dry etch process. For example, the etch process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectrics 70 may be used as etch stop layers when the dummy gates 72 are etched. The dummy dielectrics 70 may then be removed after the removal of the dummy gates 72.

FIGS. 14 through 25 illustrate steps for forming a dielectric layer and work function layers over the structure of FIGS. 13A and 13B. The work function layers are precisely patterned using a three-layer photoresist 107 (discussed in further detail below). As will be discussed in further detail below, the method illustrated in FIGS. 14 through 25 may be used to form and pattern work function layers during the formation of a metal gate. The method illustrated in FIGS. 14 through 25 is discussed in the context of forming a Fin Field-Effect Transistor (FinFET) device but is applicable to work function layer patterning in other types of devices (e.g., a planar transistor, a nano structure (including nanowire and gate all around) field effect transistor (NSFET), or the like). The embodiments discussed herein illustrate the patterning of a p-type work function layer in a p-type device. This is illustrated as an example and the methods discussed herein can be used for patterning any work function layer (e.g., a p-type work function layer or an n-type work function layer) in any type of device (e.g., a p-type device or an n-type device). FIGS. 14, 15, 16, 17, 18, 19A, 20, 21, 22, 23, 24, and 25 are illustrated along reference cross-section A-A illustrated in FIG. 1, except for multiple fins/FinFETs.

Figure 14:
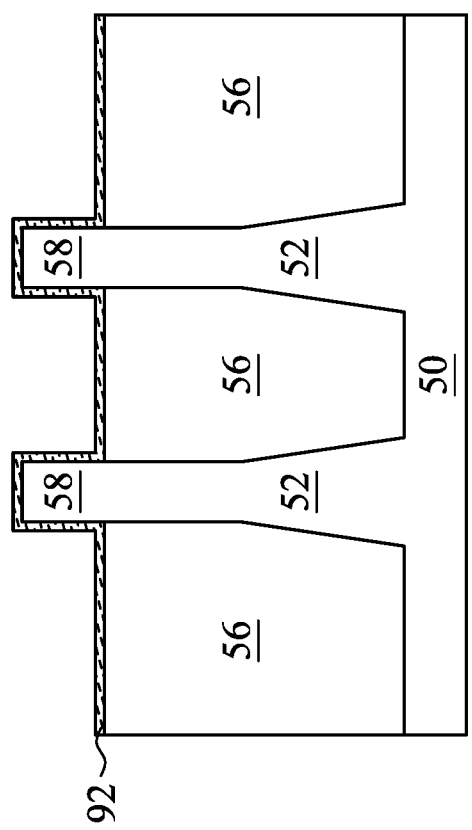

In FIG. 14, a gate dielectric layer 92 is formed over the structures of FIGS. 13A and 13B. The gate dielectric layer 92 is deposited conformally on top surfaces and sidewalls of the fins 52 and on top surfaces of the STI regions 56. In accordance with some embodiments, the gate dielectric layer 92 comprises silicon oxide, silicon nitride, or multi-layers thereof. In some embodiments, the gate dielectric layer 92 is a high-k dielectric material, and in these embodiments, the gate dielectric layer 92 may have a k value greater than about 7.0, and may include a metal oxide or a silicate of Hf, Al, Zr, La, Mg, Ba, Ti, Pb, and combinations thereof. The formation methods of the gate dielectric layer 92 may include molecular beam deposition (MBD), atomic layer deposition (ALD), PECVD, and the like. The gate dielectric layer 92 may have a thickness of between about 13 Å and about 19 Å, such as about 16 Å.

Figure 15:
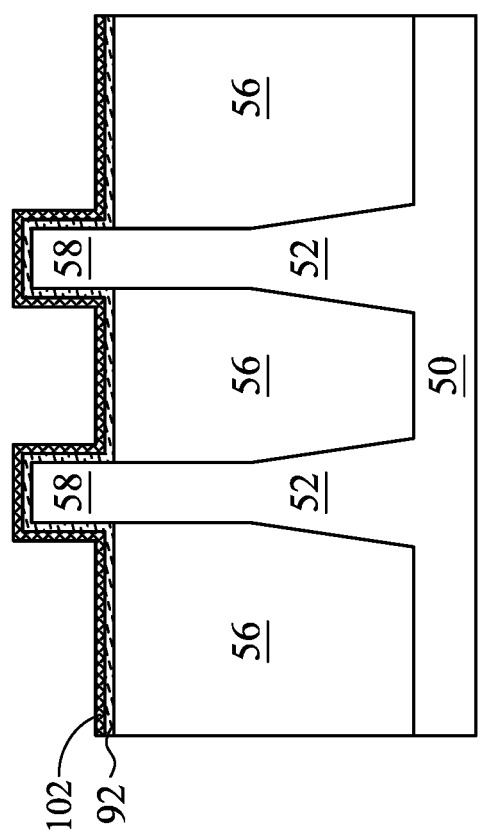

In FIG. 15, a first work function layer 102 is conformally deposited over the gate dielectric layer 92 illustrated in FIG. 14. The first work function layer 102 may be formed by a deposition process, such as ALD, CVD, PECVD, PVD, sputter deposition, or the like. The first work function layer 102 may be a p-type work function metal and may be made of, for example, TiN, TiSiN, TaN, WCN, TiO combinations thereof, or the like. The thickness of the first work function layer 102 can range from about 10 Å to about 15 Å.

In some embodiments, a barrier layer (not separately illustrated) is optionally formed between the first work function layer 102 and the gate dielectric layer 92. The barrier layer may be a metal layer and may be formed of, for example, TaN or the like. The barrier layer may be formed by a deposition process, such as ALD, CVD, PECVD, PVD, sputter deposition, or the like. The barrier layer may have a thickness of between about 12 Å and about 18 Å, such as about 15 Å.

Figure 16:
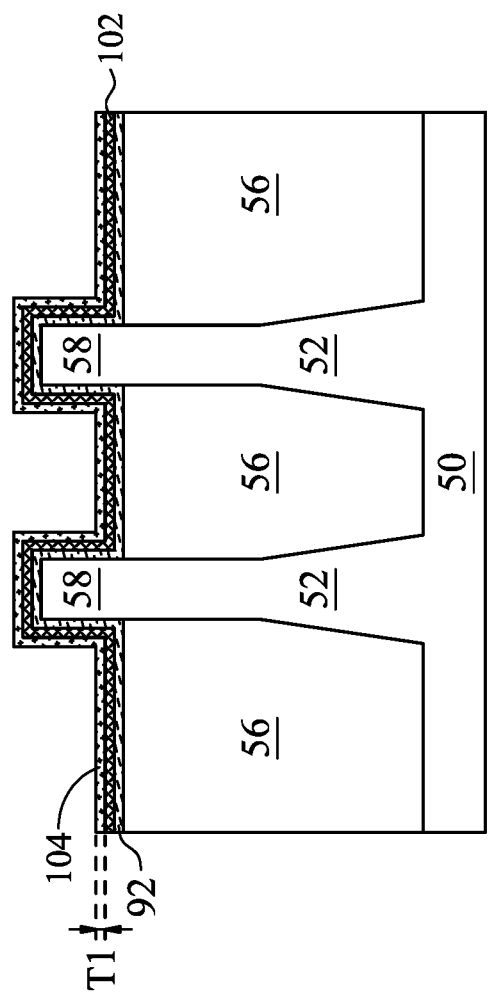

In FIG. 16, a hard mask layer 104 is formed over the first work function layer 102. The hard mask layer 104 may be formed of a material that comprises an oxide (e.g., aluminum oxide, or the like), and may be formed by PVD, Radio Frequency PVD (RFPVD), Atomic Layer Deposition (ALD), or the like. The hard mask layer 104 is used to protect the first work function layer 102 and the gate dielectric layer 92 during the etching of a subsequently deposited bottom anti-reflective coating (BARC) layer (see FIGS. 19A and 19B) over the hard mask layer 104. A material of the hard mask 104 may be selected so that the hard mask 104 has a characteristic of accumulating positive charges at an exposed, upper surface of the hard mask 104. During the subsequent etching of the BARC layer, the positive ions that are used in the etching process experience a repulsive force due to positive charge accumulation on the upper surface of the hard mask layer 104. This prevents (or at least reduces) BARC over etch damage and protects the first work function layer 102 and the gate dielectric 92 during the subsequent etching process. It has been observed that certain oxides (e.g., aluminum oxide) has this advantageous positive charge accumulation characteristic. Another advantageous feature of the present disclosure may include the ability to reduce metal gate deformation and gate width changes during subsequent patterning of the work function layer 102.

The hard mask layer 104 may have a thickness T1 of between about 8 Å and about 20 Å. It has been observed that when the hard mask layer 104 has the above thickness T1, advantages can be achieved. For example, when hard mask layer 104 is thinner than about 8 Å, insufficient BARC over etch protection is provided by the hard mask layer 104, and the first work function layer 102 and the gate dielectric 92 may be damaged during the BARC etching. As another example, when the hard mask layer 104 is thicker than about 20 Å, the hard mask layer 104 will excessively fill portions of the recess 90 and reduce the available patterning window, which will hinder precise patterning of the work function layer 102 and hard mask layer 104.

Figure 17:
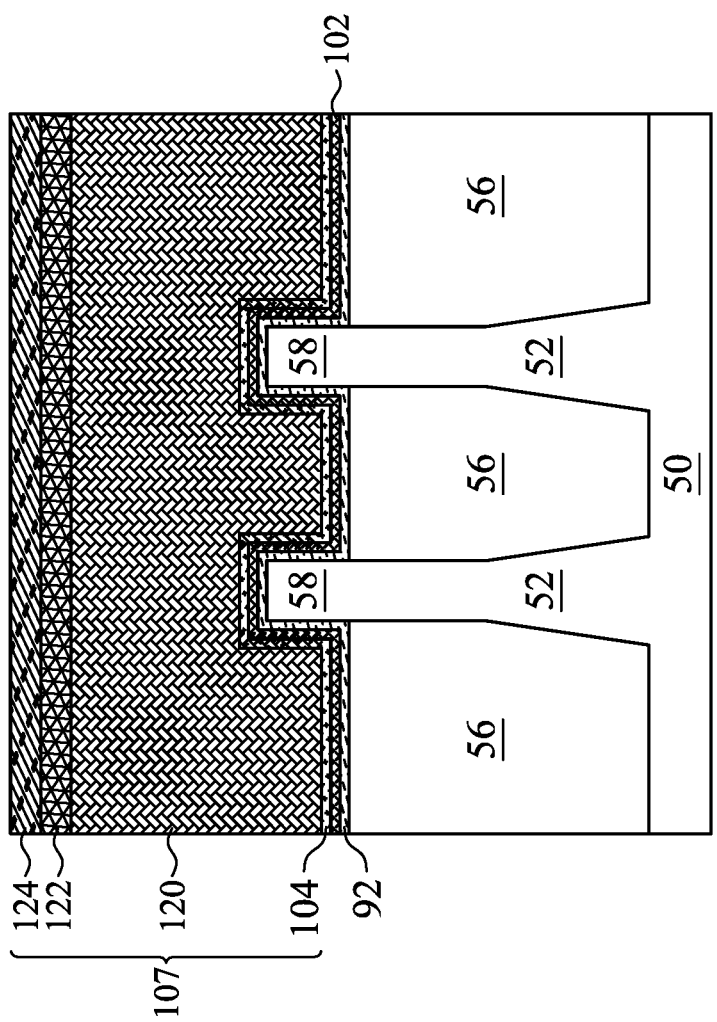

In FIG. 17, a tri-layer photoresist 107 is formed on the hard mask layer 104. The tri-layer photoresist 107 includes a bottom layer 120, a middle layer 122 over the bottom layer 120, and an upper layer 124 over the middle layer 122. The bottom layer 120 and upper layer 124 may be formed of photoresists (e.g., photosensitive materials), which include organic materials. In some embodiments, the bottom layer 120 may also be a bottom anti-reflective coating (BARC) layer. The middle layer 122 may comprise an inorganic material, which may be a nitride (such as silicon nitride), an oxynitride (such as silicon oxynitride), an oxide (such as silicon oxide, aluminum oxide), or the like. The middle layer 122 has a high etching selectivity relative to the upper layer 124 and the bottom layer 120. The various layers of the tri-layer photoresist 107 may be blanket deposited sequentially using, for example, spin-on processes. Although a tri-layer photoresist 107 is discussed herein, in other embodiments, the photoresist 107 may be a monolayer or a bilayer (e.g., comprising only the bottom layer 120 and the upper layer 124 without the middle layer 122) photoresist. The type of photoresist used (e.g., monolayer, bilayer, or tri-layer) may depend on the photolithography process used to pattern the hard mask layer 104. For example, in advanced extreme ultraviolet (EUV) lithography processes, a monolayer or bilayer photoresist 107 may be used.

Figure 18:
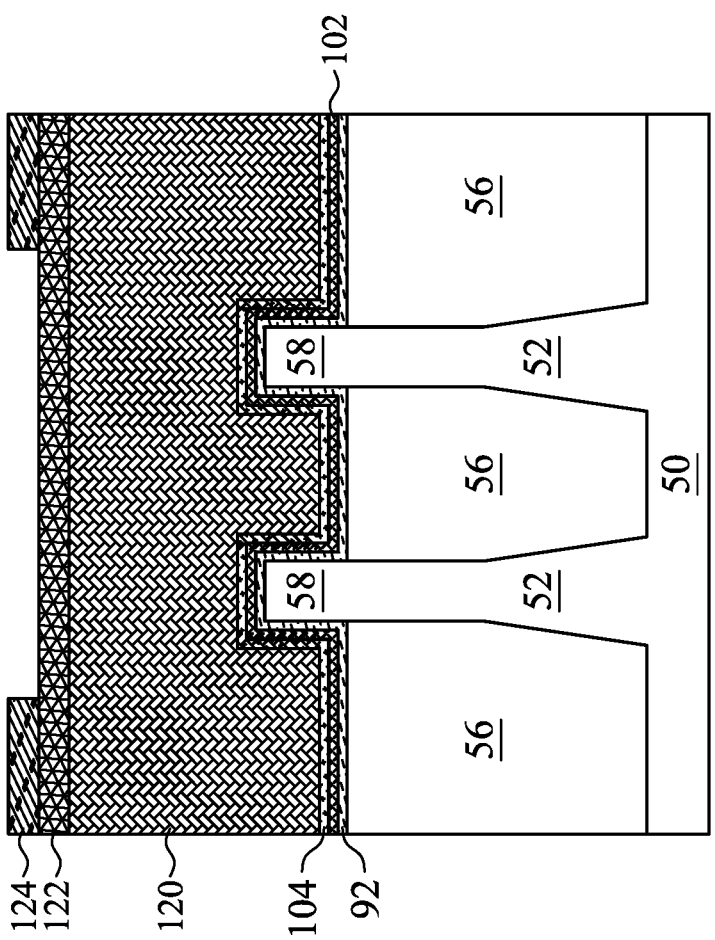

In FIG. 18, the upper layer 124 is patterned by exposing the upper layer 124 to a patterned energy source and developing the upper layer 124 to remove an exposed or unexposed portion of the upper layer 124. In some embodiments, the upper layer 124 may be patterned with immersion lithography using ultraviolet light at a wavelength of 193 nm. After the upper layer 124 is patterned, the upper layer 124 may be used as a mask to etch the underlying layers.

In FIGS. 19A and 19B, the middle layer 122 and the bottom layer 120 are etched using the patterned upper layer 124 as a mask. The middle layer 122 and the bottom layer 120 may be etched using an anisotropic etch process. For example, the middle layer 122 and the bottom layer 120 may be etched using a dry etch process, such as reactive ion etching (RIE), neutral beam etching (NBE), or the like. In some embodiments, the middle layer 122 and the bottom layer 120 may be etched by a dry etch process using an etching gas including nitrogen ($N_2$), hydrogen ($H_2$), helium (He), or the like. In further embodiments, the middle layer 122 and the bottom layer 120 may be etched by a dry etch process using a fluorine-containing etching gas such as tetrafluoromethane ($CF_4$), fluoroform ($CHF_3$), difluoromethane ($CH_2F_2$), fluoromethane ($CH_3F$), or the like.

The middle layer 122 and the bottom layer 120 may be etched simultaneously in an all-in-one etch process. In other embodiments, the middle layer 122 and the bottom layer 120 may be etched by different etchants in separate processes. After the middle layer 122 and the bottom layer 120 are etched, remaining portions of the upper layer 124 may be removed, such as by an acceptable ashing process. In other embodiments, etching the middle layer 122 and the bottom layer 120 may consume the upper layer 124, and a separate removal step of the upper layer 124 may be omitted. Thus, an opening 121 is formed extending through the middle layer 122 and the bottom layer 120. The opening 121 exposes portions of the hard mask 104.

Figure 20:
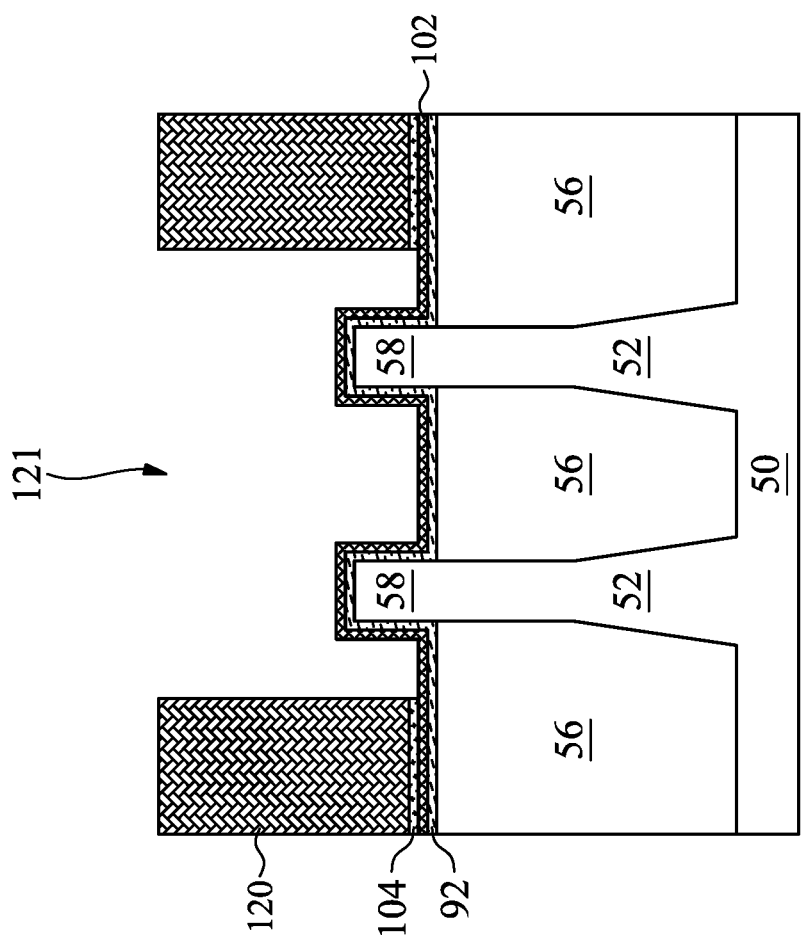

In FIG. 20, the hard mask layer 104 is selectively etched using the bottom layer 120 as a mask. For example, portions of the hard mask 104 exposed by the opening 121 is etched. Etching the hard mask layer 104 exposes the first work function layer 102 in the opening 121 through the bottom layer 120. The remaining portions of the middle layer 122 may also be etched and removed during the etching process. For example, the hard mask layer 104 and middle layer 122 may be etched using a wet etch process, or the like. In some embodiments, the middle layer has a same material composition as the hard mask layer, and the etching process simultaneously removes middle layer 122 with the hard mask layer 104. In some embodiments, the hard mask layer 104 and middle layer 122 may be etched by a wet etch process using alkaline ammonium hydroxide ($NH_4OH$). The etch process may be a timed etch process. The concentration of ammonium hydroxide ($NH_4OH$) solution may be in a range of 1 to 10 percent. The etching process may be performed at a temperature in a range of 25° C. to 50° C. The etching process is used to precisely etch the hard mask layer 104 while minimizing etch damage to the underlying first work function layer 102. A temperature of the etch process or a concentration of ammonium hydroxide ($NH_4OH$) solution outside of the ranges given above may result in over etching and damage to the first work function layer 102 or may result in under etching of the first hard mask layer 104 such that the first work function layer 102 is not exposed.

Figure 21:
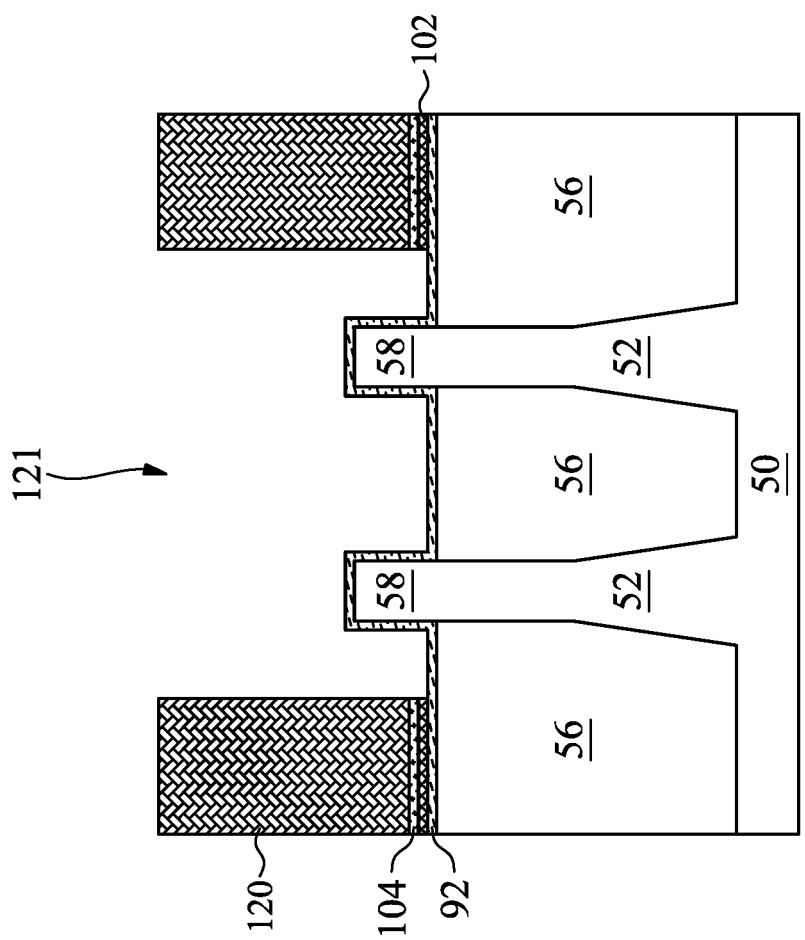

In FIG. 21, the first work function layer 102 is selectively etched using the bottom layer 120 as a mask. For example, portions of the first work function layer 102 exposed by the opening 121 is etched. The first work function layer 102 may be etched using one or more wet etch processes, or the like. In some embodiments, the first work function layer 102 may be etched by a wet etch process using an etch solution that may comprise ozonated de-ionized water, hydrochloric acid (HCl), and hydrogen peroxide ($H_2O_2$). The concentration of hydrochloric acid (HCl) solution may be in a range of 1 to 10 percent and the concentration of hydrogen peroxide ($H_2O_2$) solution may be in a range of 1 to 10 percent. The etching process may be performed at a temperature in a range of 25° C. to 50° C. The etching process is used to precisely etch the first work function layer 102 while minimizing etch damage to the underlying gate dielectric layer 92. A temperature of the etch process or concentrations of hydrochloric acid (HCl) solution and hydrogen peroxide ($H_2O_2$) exceeding the ranges given above may result in under etching of the first work function layer 102 such that the gate dielectric layer 92 is not exposed, or over etching and damage to the gate dielectric layer 92. The etch process may be a timed etch process. In some embodiments, a timed etch is used to etch the first work function layer 102 until a desired thickness of the first work function layer 102 is achieved.

Figure 22:
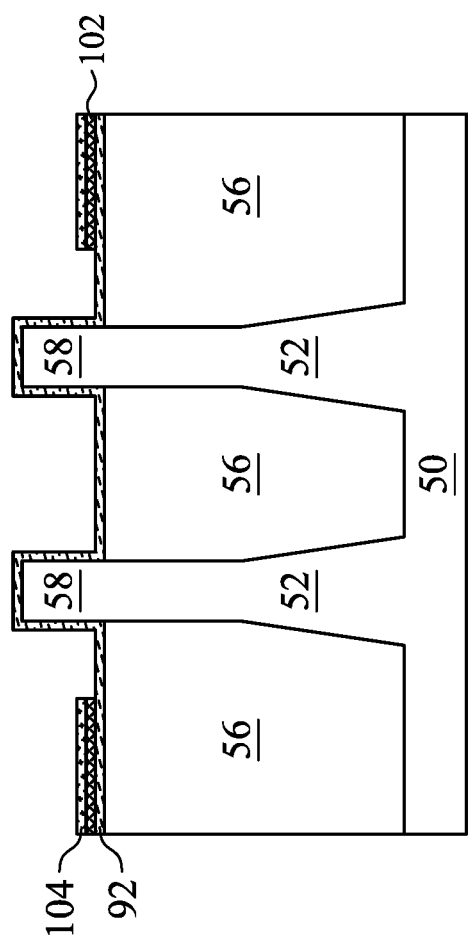

In FIG. 22, the remainder of the bottom layer 120 is removed. In some embodiments, the bottom layer 120 may be removed by plasma ashing or the like. For example the bottom layer 120 may be removed by a plasma ashing process using a process gas including nitrogen ($N_2$), hydrogen ($H_2$), combinations thereof, or the like. Further in FIG. 22, a wet etch process, such as a wet etch using an etch solution including diluted hydrofluoric acid (dHF), may be performed to remove any oxides or other impurities remaining on the first gate dielectric layer 92.

Figure 23:
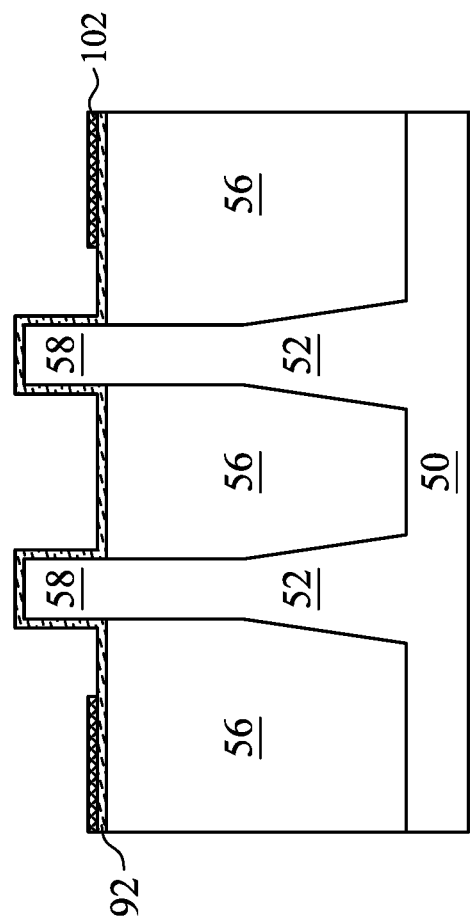

In FIG. 23, remaining portions of the hard mask layer 104 are removed using an etching process. For example, remaining portions of the hard mask layer 104 may be etched using a wet etch process, or the like. In some embodiments, the hard mask layer 104 may be etched by a wet etch process using alkaline ammonium hydroxide ($NH_4OH$). The etch process may be a timed etch process. The concentration of ammonium hydroxide ($NH_4OH$) solution may be in a range of 1 to 10 percent. The etching process may be performed at a temperature in a range of 25° C. to 50° C. The etching process is used to precisely etch the hard mask layer 104 while minimizing etch damage to the underlying first work function layer 102. A temperature of the etch process or a concentration of ammonium hydroxide ($NH_4OH$) solution exceeding the ranges given above may result in under etching of the hard mask layer 104 such that the first work function layer 102 is not exposed, or over etching and damage to the first work function layer 102.

Figure 24:
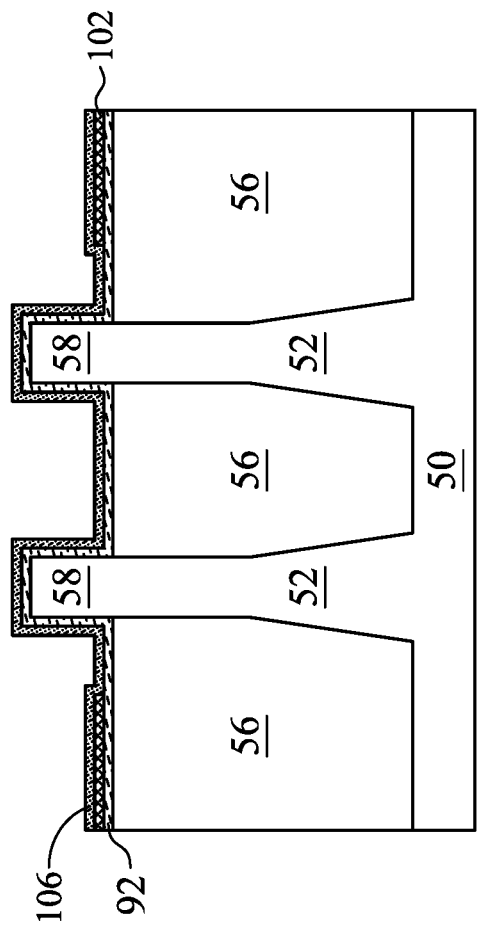

In FIG. 24, a second work function layer 106 is conformally deposited over the gate dielectric layer 92 and the first work function layer 102 illustrated in FIG. 23. The second work function layer 106 may be deposited to extend through patterned areas of the first work function layer 102 to contact the underlying gate dielectric layer 92, for example. The second work function layer 106 may be formed by a deposition process, such as ALD, CVD, PECVD, PVD, sputter deposition, or the like. The second work function layer 106 may be a n-type work function metal and may be made of, for example, Ti, Ag, TaAl, TaAlC, TiAlN, TaC, TaCN, TaSiN, Mn, Zr, combinations thereof, or the like. The second work function layer 106 may comprise a single layer or multiple layers. The second work function layer 106 may have a thickness of between about 10 Å to 30 Å. In other alternative embodiments, the first work function layer 102 may be a n-type work function metal and the second work function metal 106 may be a p-type work function metal.

Figure 25:
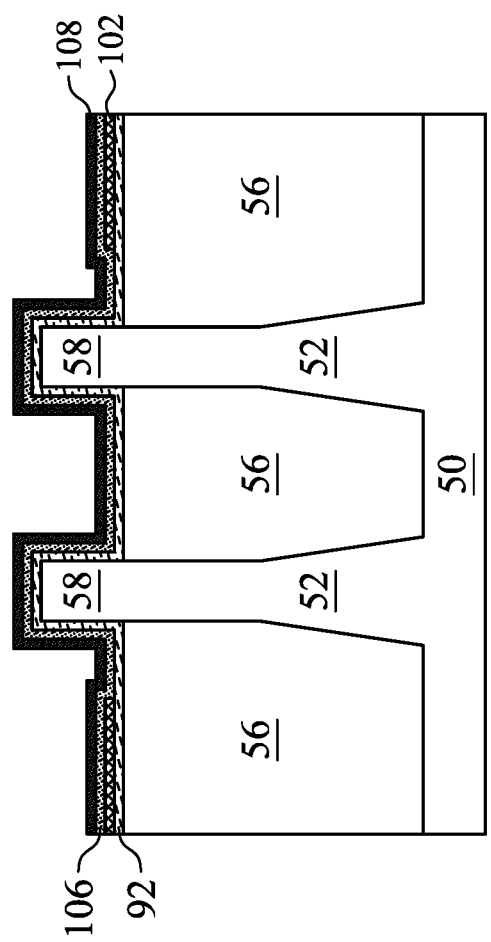

In FIG. 25, a glue layer (or a wetting layer) 108 is deposited conformally over the second work function layer 106. The glue layer 108 may be used to facilitate a subsequent formation of a conductive filling layer. The glue layer 108 may be made of, for example, Co, TiN, TaN, the like, or a combination thereof. In some embodiments, the glue layer 108 may be deposited using an ALD, CVD, PECVD, PVD, supper deposition process, or the like.

Figures 26A, 26B:
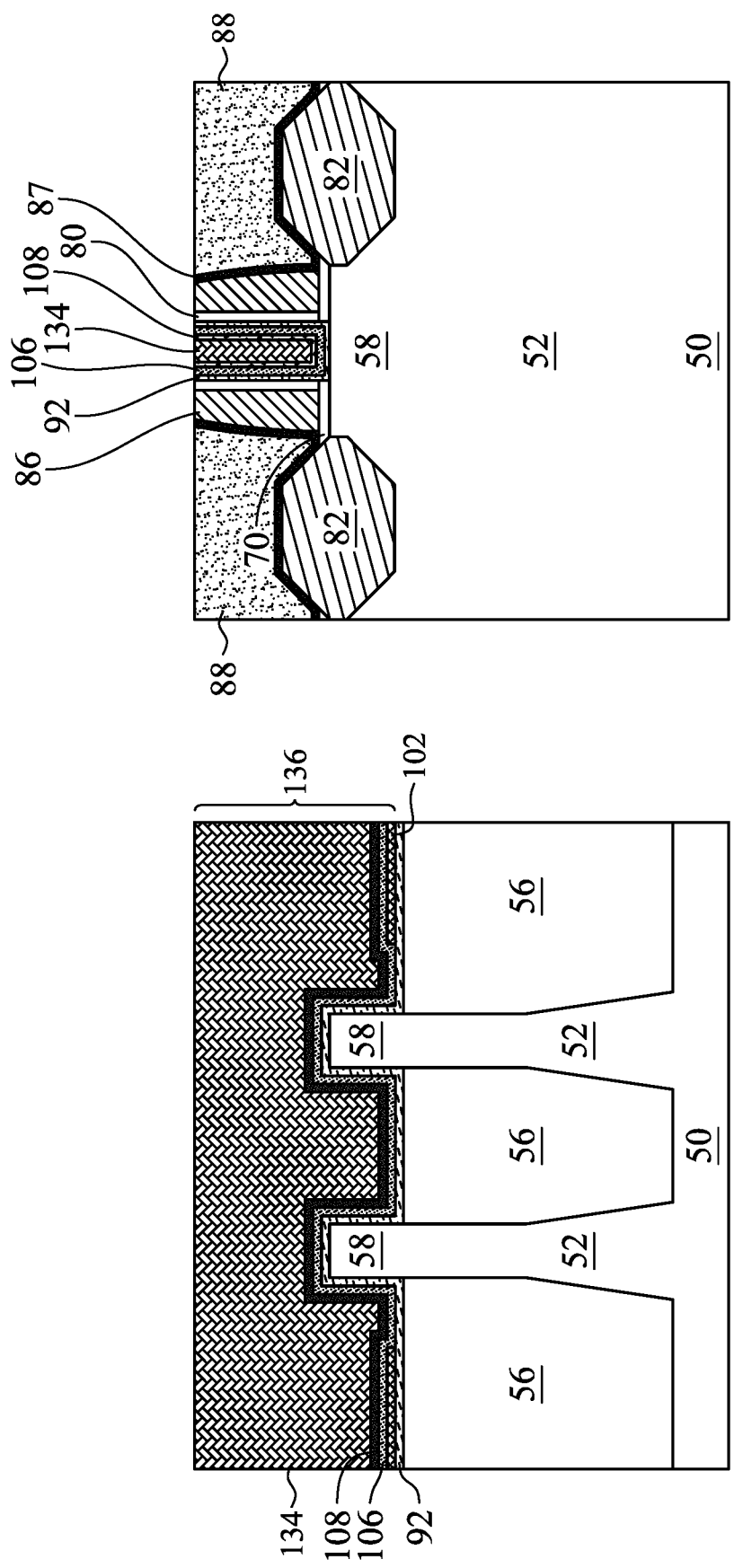

In FIGS. 26A and 26B, a conductive fill material 134 is formed on the glue layer 108. In FIGS. 26A and 26B, the gate dielectric layer 92, the first work function layer 102, the second work function layer 106, and the glue layer 108 are illustrated. The conductive fill material 134 is deposited over the glue layer 108 and fills the remaining portions of the recess 90. The conductive fill material 134 may include a metal-containing material such as TiN, TiO, TaN, TaC, Co, Ru, Al, W, combinations thereof, or multi-layers thereof. After the filling of the conductive fill material 134, a planarization process, such as a CMP, may be performed to remove the excess portions of the gate dielectric layer 92, the first work function layer 102, the second work function layer 106, the glue layer 108, and the material of the conductive fill material 134, which excess portions are over the top surface of the first ILD 88. The remaining portions of material of the conductive fill material 134, the gate dielectric layer 92, the first work function layer 102, the second work function layer 106, and the glue layer 108, thus form replacement gates of the resulting FinFETs. The remaining portions of the first work function layer 102, the second work function layer 106, the glue layer 108, and the material of the conductive fill material 134 may be collectively referred to herein as a gate electrode 136. As illustrated in FIG. 26B, the conductive fill material 134, the gate dielectric layer 92, the second work function layer 106, and the glue layer 108 may be collectively referred to as a "gate stack." The gate and the gate stacks may extend along sidewalls of a channel region 58 of the fins 52.

Although FIGS. 26A and 26B illustrate a particular pattern for the removal of the work function layer 102 that minimizes damage to the gate dielectric layer 92, the method of the present disclosure is not limited to the particular configuration illustrated and may be used for other configurations that involve the selective removal of the work function layer 102. Other configurations may include the selective removal of other p-work function metals such as TiN, TiSiN, TaN, WCN, TiO, or the like.

Figure 27B:
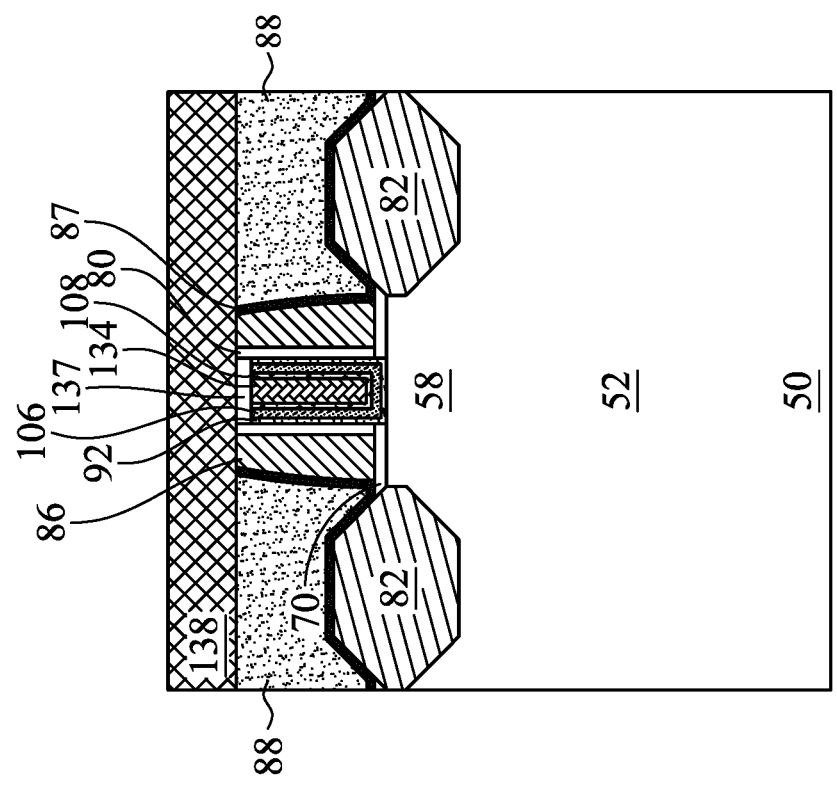
Figure 27A:
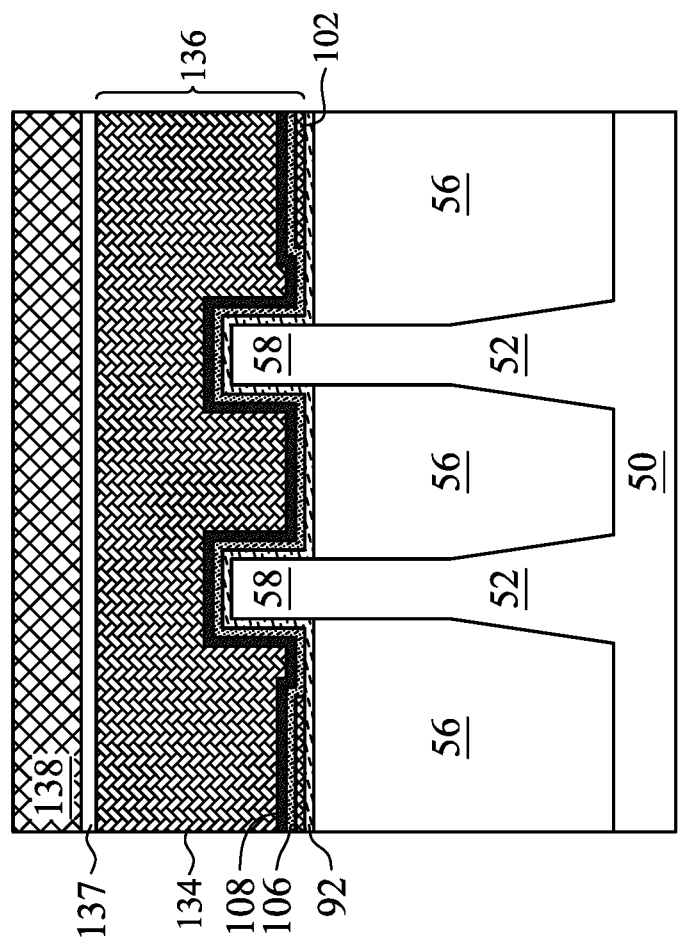

In FIGS. 27A and 27B, a gate mask 137 formed on the gate dielectric layer 92 and the gate electrode 136. In accordance with some embodiments, the gate dielectric layer 92 and the gate electrode 136 (e.g., including the first work function layer 102, the second work function layer 106, the glue layer 108, and the conductive fill material 134) are recessed, so that a recess is formed directly over the gate stack and between opposing portions of the gate spacers 86, as illustrated in FIGS. 27A and 27B. A gate mask 137 comprising one or more layers of dielectric material, such as silicon nitride, silicon oxynitride, or the like, is filled in the recess, followed by a planarization process to remove excess portions of the dielectric material extending over the first ILD 88.

As also illustrated by FIGS. 27A and 27B, a second ILD 138 is deposited over the first ILD 88. In some embodiment, the second ILD 138 is a flowable film formed by a flowable CVD method. In some embodiments, the second ILD 138 is formed of a dielectric material such as PSG, BSG, BPSG, USG, or the like, and may be deposited by any suitable method, such as CVD and PECVD. The subsequently formed gate contacts 140 (FIGS. 28A and 28B) penetrate through the gate mask 137 to contact the top surface of the recessed conductive fill material 134.

Figures 28A, 28B:
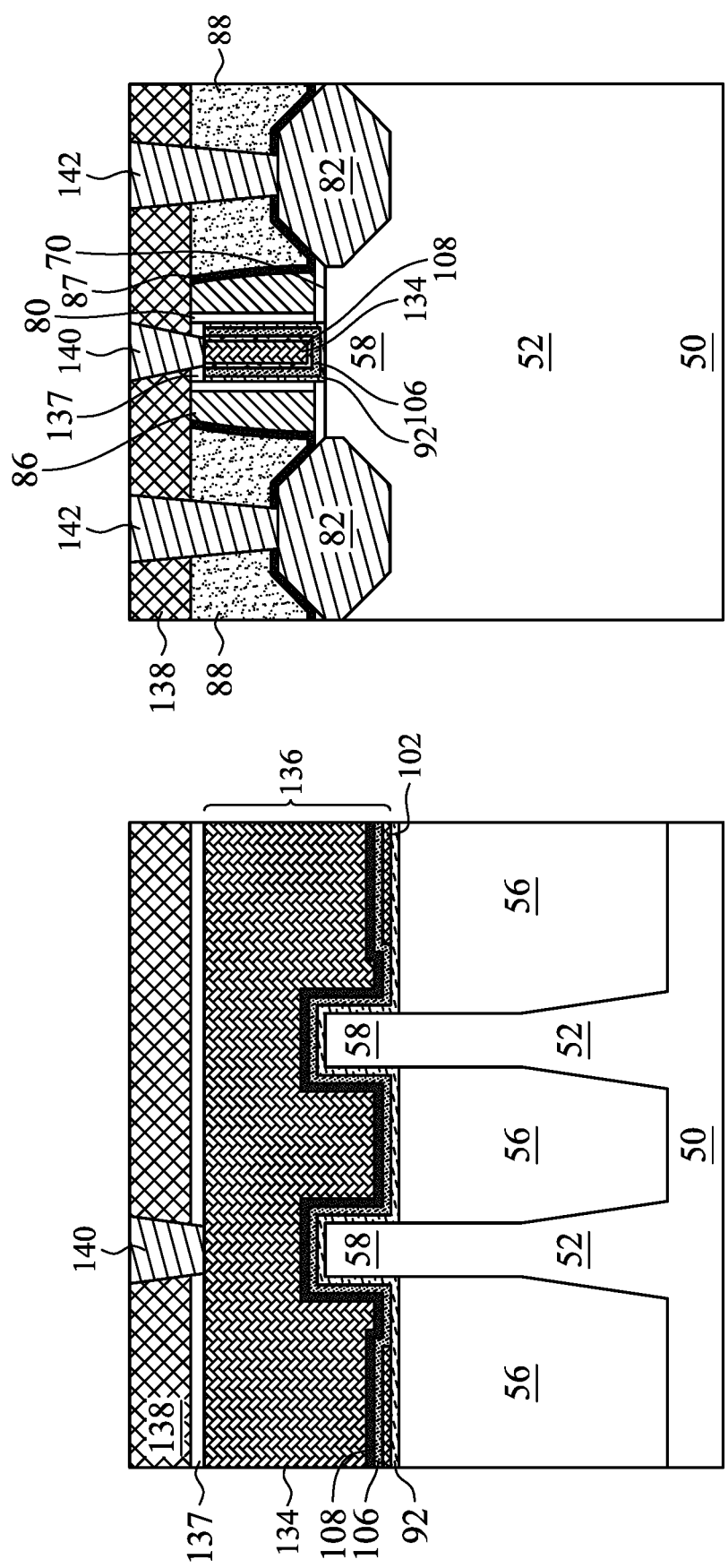

In FIGS. 28A and 28B, gate contacts 140 and source/drain contacts 142 are formed through the second ILD 138 and the first ILD 88 in accordance with some embodiments. Openings for the source/drain contacts 142 are formed through the first ILD 88 and the second ILD 138, and openings for the gate contact 140 are formed through the second ILD 138 and the gate mask 137. The openings may be formed using acceptable photolithography and etching techniques. A liner, which may include a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 138. The remaining liner and conductive material form the source/drain contacts 142 and gate contacts 140 in the openings. An anneal process may be performed to form a silicide at the interface between the epitaxial source/drain regions 82 and the source/drain contacts 142. The source/drain contacts 142 are physically and electrically coupled to the epitaxial source/drain regions 82, and the gate contacts 140 are physically and electrically coupled to the conductive fill material 134. The source/drain contacts 142 and gate contacts 140 may be formed in different processes, or may be formed in the same process. Although shown as being formed in the same cross-sections, it should be appreciated that each of the source/drain contacts 142 and the gate contacts 140 may be formed in different cross-sections, which may avoid shorting of the contacts.

The embodiments of the present disclosure as illustrated in FIG. 1 through FIG. 28B describe a patterning process used to precisely pattern a work function layer. The patterning process may utilize a first hard mask layer over the work function layer, and a photoresist over the first hard mask layer, wherein the photoresist may include a bottom anti-reflective coating (BARC) layer, a second hard mask layer, and a photoresist layer. Forming the first hard mask layer over the work function layer allows for the use of a wet etching process to precisely pattern the work function layer. The precise patterning of the work function layer may be used, for example, to fine tune a threshold voltage (Vt) of the resulting transistor, to precisely control the metal gate height, and allow for precise removal of the work function layer in certain areas. Advantageous features of one or more embodiments disclosed may include the ability to minimize damage to the gate dielectric layer during the patterning of the work function layer, and reducing metal gate deformation and gate width changes during the patterning of the work function layer.

In accordance with an embodiment, a method includes depositing a first work function layer over a gate dielectric layer; forming a first hard mask layer over the first work function layer; forming a photoresist mask over the first hard mask layer, where forming the photoresist mask includes depositing a bottom anti-reflective coating (BARC) layer over the first hard mask layer; etching a portion of the BARC layer; etching a portion of the first hard mask layer using the BARC layer as a mask; etching a portion of the first work function layer to expose a portion of the gate dielectric layer through the first hard mask layer and the first work function layer; removing the first hard mask layer; and depositing a second work function layer over the first work function layer and over the portion of the gate dielectric layer. In an embodiment, forming the first hard mask layer includes depositing a material that accumulates positive charge on exposed surfaces of the material. In an embodiment, where the first hard mask layer includes aluminum oxide. In an embodiment, forming the first hard mask layer includes depositing an oxide having a thickness in a range of 8 Å to 20 Å. In an embodiment, forming the photoresist mask further includes forming a second hard mask layer over the BARC layer; and forming a photo sensitive layer over the second hard mask layer. In an embodiment, the first hard mask layer and the second hard mask layer have a same material composition. In an embodiment, etching the portion of the first work function layer includes a wet etch process using the BARC layer as a mask. In an embodiment, the first work function layer is a p-type work function layer and the second work function layer is an n-type work function layer. In an embodiment, the first work function layer is an n-type work function layer and the second work function layer is a p-type work function layer.

In accordance with yet another embodiment, a method includes depositing a gate dielectric layer over a semiconductor substrate; depositing a first work function layer over the gate dielectric layer; depositing a first hard mask layer over the first work function layer, the first hard mask layer including aluminum oxide; depositing a bottom anti-reflective coating (BARC) layer over the first work function layer; patterning the BARC layer; etching a portion of the first hard mask layer and a portion of the first work function layer to expose a portion of the gate dielectric layer, where during the etching the BARC layer is used as a mask; and depositing a second work function layer over the exposed portion of the gate dielectric layer. In an embodiment, etching the portion of the first hard mask layer and the portion of the first work function layer includes a first wet etch process using alkaline ammonium hydroxide ($NH_4OH$) that removes the portion of the first hard mask layer; and a second wet etch process using a mixture including ozonated de-ionized water, hydrochloric acid (HCl), and hydrogen peroxide ($H_2O_2$) that removes the portion of the first work function layer. In an embodiment, the method further includes depositing an oxide layer over the BARC layer; and spin-on coating a photoresist layer over the oxide layer. In an embodiment, the first wet etch process removes portions of the oxide layer. In an embodiment, the alkaline ammonium hydroxide ($NH_4OH$) solution has a temperature in a range of 25° C. to 50° C. and a concentration in a range of 1 to 10 percent. In an embodiment, a temperature of the second wet etch process is in a range of 25° C. to 50° C. In an embodiment, during the second wet etch process a concentration of hydrochloric acid (HCl) solution and a concentration of hydrogen peroxide ($H_2O_2$) solution is in a range of 1 to 10 percent.

In accordance with yet another embodiment, a method includes depositing a first work function layer over a semiconductor fin; depositing a first hard mask layer over the first work function layer, the first hard mask layer including a first material; forming a bottom anti-reflective coating (BARC) layer over the first hard mask layer; depositing a second hard mask layer over the BARC layer; performing an etching process that uses positive ions to remove portions of the BARC layer, where during the etching process the positive ions of the etching process experience a repulsive force from the first material; removing a portion of the first hard mask layer to expose a portion of the first work function layer; and removing the portion of the first work function layer through the first hard mask layer. In an embodiment, removing the portion of the first work function layer exposes a portion of a gate dielectric layer that underlies the first work function layer. In an embodiment, the method further includes depositing a second work function layer over the first work function layer, through the first work function layer, and over the portion of the gate dielectric layer. In an embodiment, removing the portion of the first hard mask layer and removing the portion of the first work function layer each includes using the BARC layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a semiconductor fin protruding from a shallow trench isolation (STI) region;

depositing a gate dielectric layer over the semiconductor fin and the STI region;

depositing a first work function layer over the gate dielectric layer;

forming a first hard mask layer over the first work function layer;

forming a photoresist mask over the first hard mask layer, wherein forming the photoresist mask comprises:
  depositing a bottom anti-reflective coating (BARC) layer over the first hard mask layer;
  depositing a second hard mask layer over the BARC layer, wherein the second hard mask layer comprises an inorganic material; and
  depositing an organic layer over the second hard mask layer;

etching a portion of the BARC layer and the second hard mask layer;

etching a portion of the first hard mask layer using the BARC layer as a mask;

etching a first portion of the first work function layer over the semiconductor fin to expose a portion of the gate dielectric layer through the first hard mask layer and the first work function layer, wherein after etching the first portion of the first work function layer, remaining portions of the first work function layer are disposed over the STI region;

removing the first hard mask layer; and depositing a second work function layer over the remaining portions of the first work function layer and over the portion of the gate dielectric layer, wherein a first sidewall of the first work function layer and a second sidewall of the second work function layer are in physical contact, and wherein the first sidewall extends from a bottommost surface of the first work function layer, and the second sidewall extends from a bottommost surface of the second work function layer.

2. The method of claim 1, wherein forming the first hard mask layer comprises depositing a material that accumulates positive charge on exposed surfaces of the material.

3. The method of claim 1, wherein the first hard mask layer comprises aluminum oxide.

4. The method of claim 1, wherein the forming the first hard mask layer comprises depositing an oxide having a thickness in a range of 8 Å to 20 Å.

5. The method of claim 1, wherein the first hard mask layer and the second hard mask layer have a same material composition.

6. The method of claim 1, wherein etching the first portion of the first work function layer comprises a wet etch process using the BARC layer as a mask.

7. The method of claim 1, wherein the first work function layer is a p-type work function layer and the second work function layer is an n-type work function layer.

8. The method of claim 1, wherein the first work function layer is an n-type work function layer and the second work function layer is a p-type work function layer.

9. The method of claim 1, wherein the second hard mask layer has a high etch selectivity relative to the BARC layer and the organic layer.

10. A method of forming a semiconductor device, the method comprising:

forming a fin over a semiconductor substrate;

depositing a gate dielectric layer over a top surface and sidewalls of the fin;

depositing a first work function layer over the gate dielectric layer;

depositing a first hard mask layer over the first work function layer, the first hard mask layer comprising aluminum oxide;

depositing a bottom anti-reflective coating (BARC) layer over the first work function layer;

depositing a second hard mask layer over the BARC layer;

forming a photoresist layer over the second hard mask layer, wherein bottommost surfaces of the second hard mask layer and the photoresist layer are above the top surface of the fin, and a bottommost surface of the BARC layer is below the top surface of the fin;

patterning the BARC layer;

etching a portion of the first hard mask layer and a portion of the first work function layer to expose a portion of the gate dielectric layer, wherein during the etching the BARC layer is used as a mask, wherein etching the portion of the first hard mask layer comprises a first wet etch process using alkaline ammonium hydroxide ($NH_4OH$) that removes the portion of the aluminum oxide first hard mask layer; and depositing a second work function layer over the exposed portion of the gate dielectric layer.

11. The method of claim 10, wherein etching the portion of the first hard mask layer and the portion of the first work function layer comprises a second wet etch process using a mixture comprising ozonated de-ionized water, hydrochloric acid (HCl), and hydrogen peroxide ($H_2O_2$) that removes the portion of the first work function layer.

12. The method of claim 11, wherein a temperature of the second wet etch process is in a range of 25° C. to 50° C.

13. The method of claim 11, wherein during the second wet etch process a concentration of hydrochloric acid (HCl) solution and a concentration of hydrogen peroxide ($H_2O_2$) solution is in a range of 1 to 10 percent.

14. The method of claim 10, wherein the first wet etch process removes portions of the second hard mask layer.

15. The method of claim 10, wherein the alkaline ammonium hydroxide ($NH_4OH$) solution has a temperature in a range of 25° C. to 50° C. and a concentration in a range of 1 to 10 percent.

16. The method of claim 10, wherein the second hard mask layer is an oxide.

17. A method comprising:

depositing a gate dielectric layer over a semiconductor fin;

depositing a first work function layer over the gate dielectric layer;

depositing a first hard mask layer over the first work function layer, the first hard mask layer comprising a first material;

forming a bottom anti-reflective coating (BARC) layer over the first hard mask layer;

depositing a second hard mask layer over the BARC layer;

forming a photoresist layer over the second hard mask layer, wherein the BARC layer, the second hard mask layer, and the photoresist layer are isolated from the semiconductor fin by the first hard mask layer;

performing an etching process that uses positive ions to remove portions of the BARC layer, wherein during the etching process the positive ions of the etching process experience a repulsive force from the first material;

removing a portion of the first hard mask layer to expose a portion of the first work function layer; and removing the portion of the first work function layer through the first hard mask layer, wherein after removing the portion of the first work function layer, a topmost surface of the first work function layer is below a topmost surface of the gate dielectric layer.

18. The method of claim 17, wherein removing the portion of the first work function layer exposes a portion of the gate dielectric layer that underlies the first work function layer.

19. The method of claim 17, further comprising depositing a second work function layer over the first work function layer, through the first work function layer, and over the portion of the gate dielectric layer.

20. The method of claim 17, wherein removing the portion of the first hard mask layer and removing the portion of the first work function layer each comprises using the BARC layer as a mask.

* * * * *